United States Patent
Namekawa

(10) Patent No.: US 8,045,414 B2
(45) Date of Patent: Oct. 25, 2011

(54) NON-VOLATILE SEMICONDUCTOR MEMORY DEVICE

(75) Inventor: Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 12/553,616

(22) Filed: Sep. 3, 2009

(65) Prior Publication Data

US 2010/0110750 A1 May 6, 2010

(30) Foreign Application Priority Data

Nov. 4, 2008 (JP) ................................. 2008-283230

(51) Int. Cl.
*G11C 17/18* (2006.01)
(52) U.S. Cl. .................................................. 365/225.7
(58) Field of Classification Search ................ 365/225.7
See application file for complete search history.

(56) References Cited

U.S. PATENT DOCUMENTS

| | | | |
|---|---|---|---|
| 6,667,902 B2* | 12/2003 | Peng | 365/182 |
| 6,671,040 B2 | 12/2003 | Fong et al. | |
| 7,206,214 B2* | 4/2007 | Hoefler et al. | 365/94 |
| 7,590,018 B2 | 9/2009 | Namekawa | |
| 2007/0016738 A1* | 1/2007 | Hosono et al. | 711/156 |
| 2008/0068916 A1* | 3/2008 | Sako | 365/226 |
| 2008/0080295 A1 | 4/2008 | Namekawa et al. | |
| 2008/0165564 A1 | 7/2008 | Namekawa | |
| 2008/0165586 A1 | 7/2008 | Matsufuji et al. | |
| 2008/0316852 A1 | 12/2008 | Matsufuji et al. | |

* cited by examiner

*Primary Examiner* — Huan Hoang
*Assistant Examiner* — Min Huang
(74) *Attorney, Agent, or Firm* — Oblon, Spivak, McClelland, Maier & Neustadt, L.L.P.

(57) ABSTRACT

The row decoder receives writing instruction signal and reading instruction signal to selectively activate one of the word lines according to an input state of row address signals. The data buffer receives a data input signal when the writing instruction signal is received, and drives corresponding one of the bit lines and amplifies a minute reading signal transmitted to one of the bit lines to output a data output signal when the reading instruction signal is received.

The power supply circuit supplies a certain voltage to the memory cell, and in response to the reading instruction signal, keeps the voltage at a ground potential.

16 Claims, 22 Drawing Sheets

FIG. 3A  INITIAL STANDBY STATE
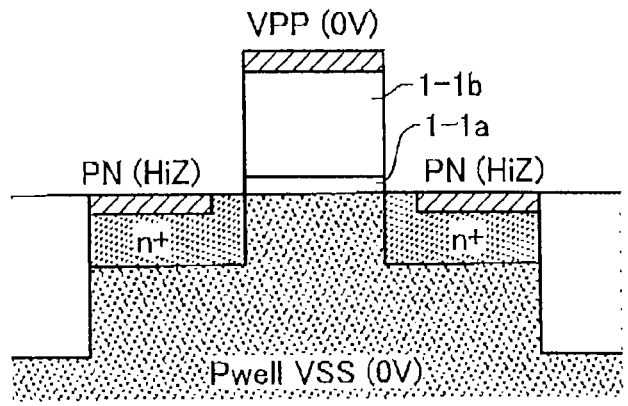
FIG. 3B
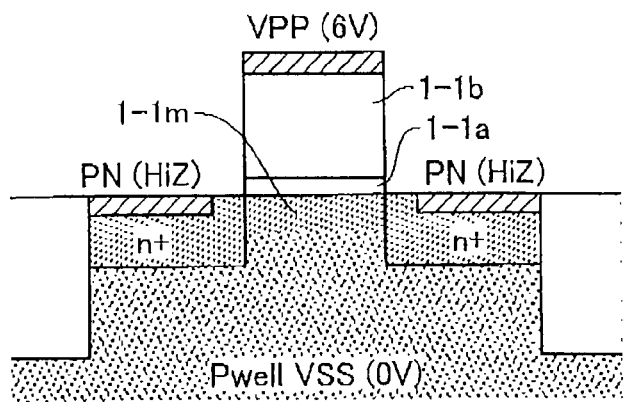
FIG. 3C  WRITE STATE
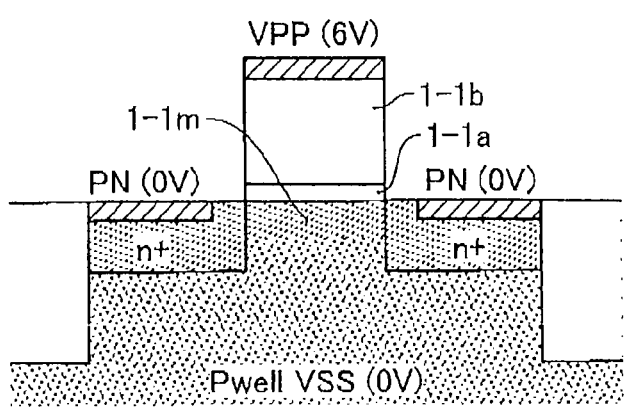

FIG. 4D    READ STATE IN "1" CELL
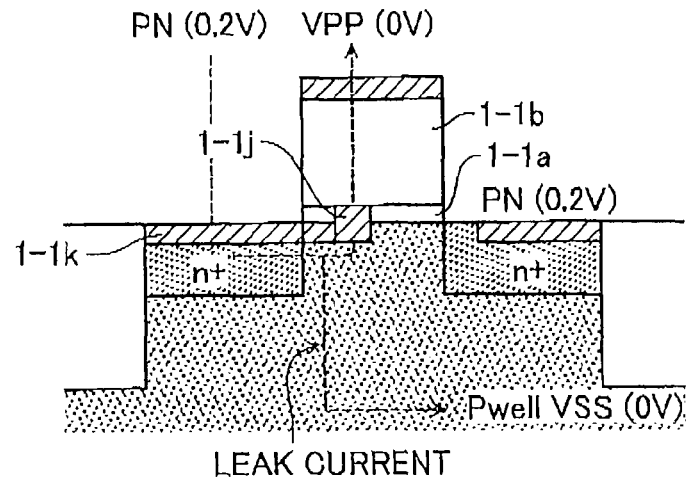
FIG. 4E    READ STANDBY STATE IN "0" CELL
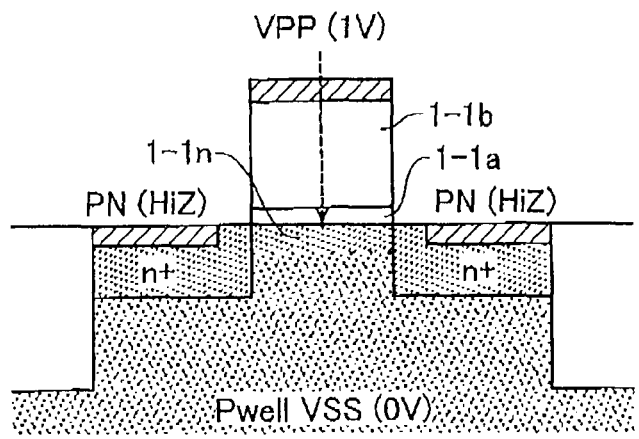
FIG. 4F    READ STATE IN "0" CELL
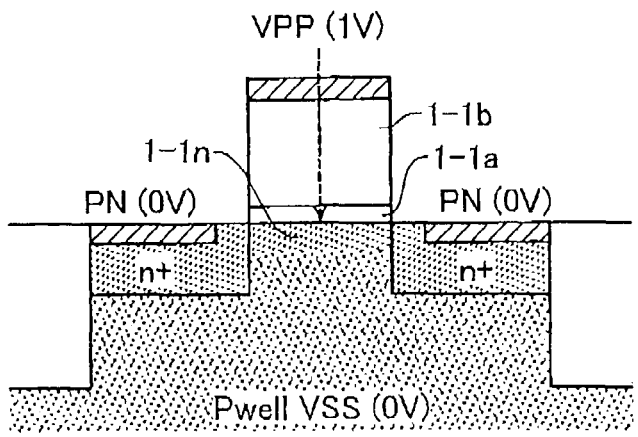

FIG. 6D  BREAKDOWN STATE
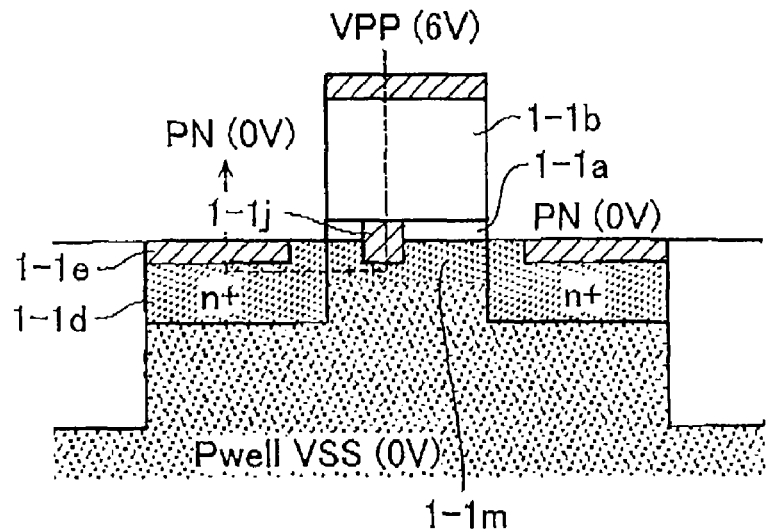
FIG. 6E  STANDBY STATE AFTER WRITE
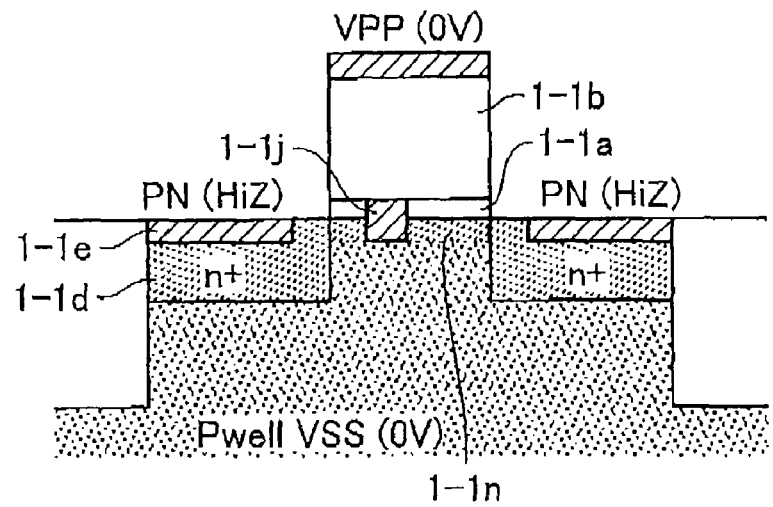

FIG. 7A  READ STANDBY STATE IN "0" CELL
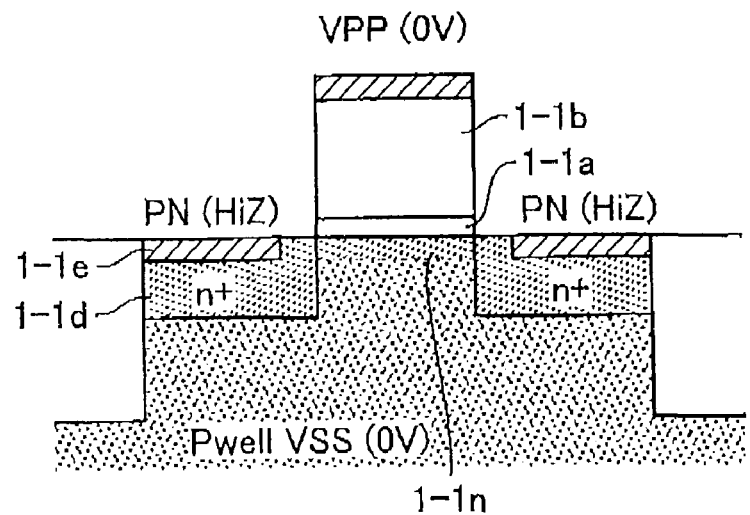
FIG. 7B  READ STATE IN "0" CELL
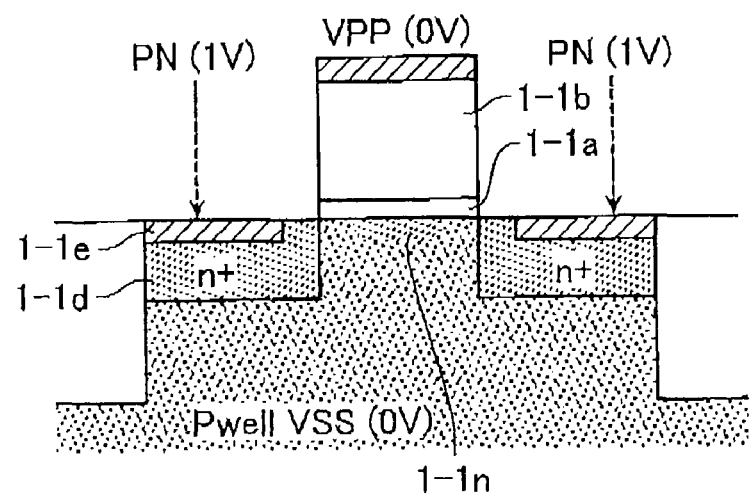

FIG. 13A    INITIAL STANDBY STATE
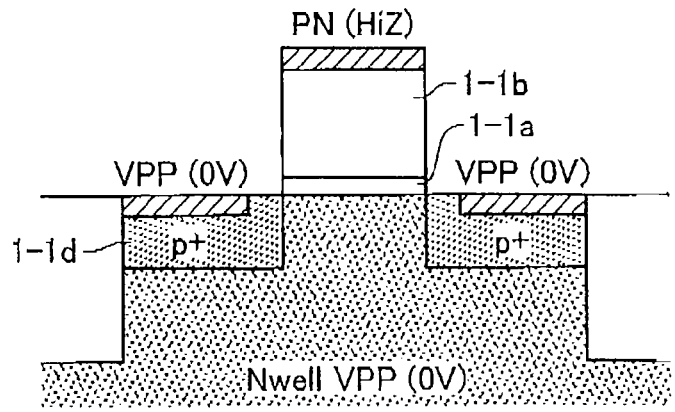
FIG. 13B
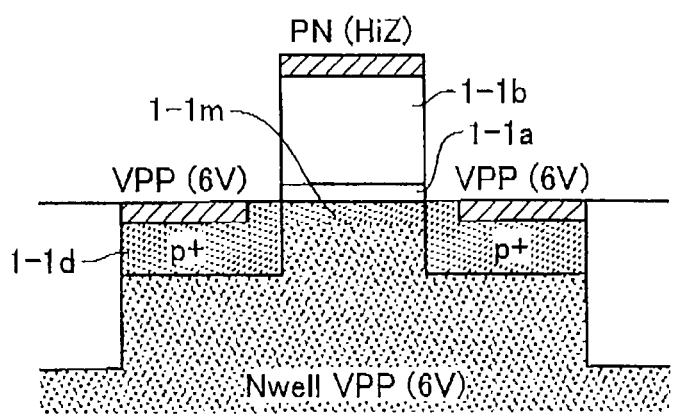
FIG. 13C    WRITE STATE
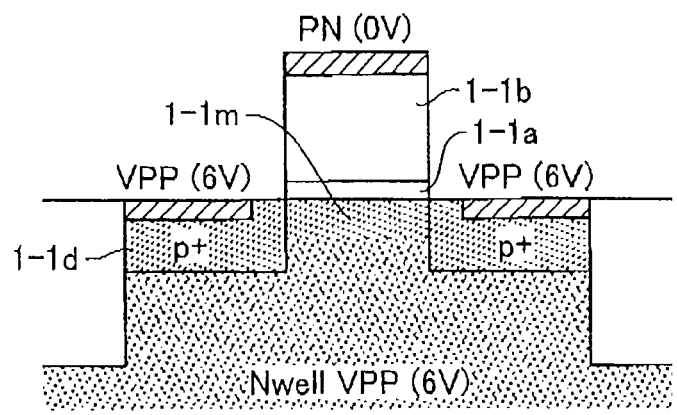

BREAKDOWN STATE

STANDBY STATE AFTER WRITE

FIG. 14A  READ STANDBY STATE IN "0" CELL
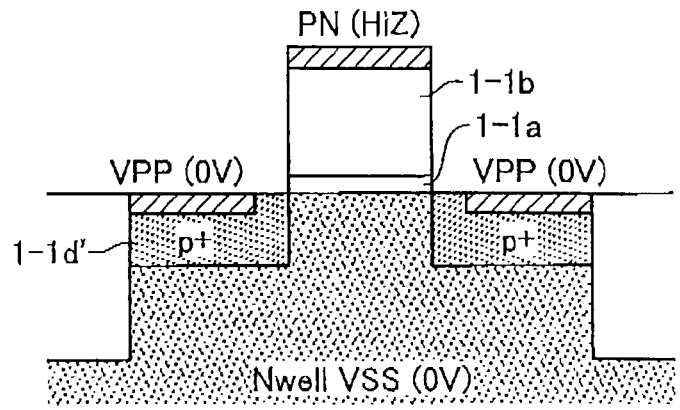
FIG. 14B  READ STATE IN "0" CELL
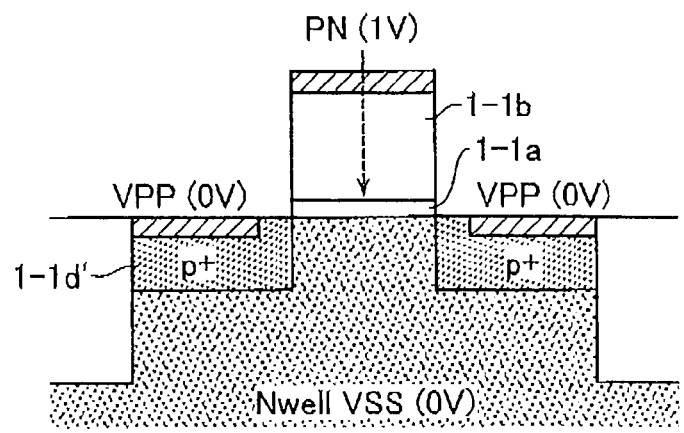
FIG. 14C  READ STANDBY STATE IN "1" CELL
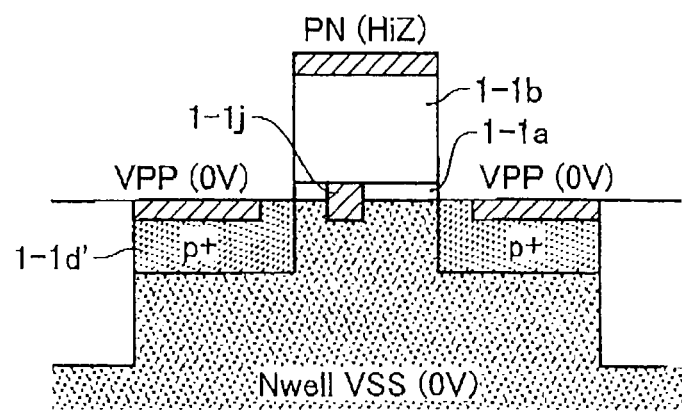

READ STATE IN "1" CELL

READ STANDBY STATE IN "0" CELL

READ STATE IN "0" CELL

READ STANDBY STATE IN "1" CELL

READ STATE IN "1" CELL

NON-VOLATILE SEMICONDUCTOR MEMORY DEVICE

CROSS REFERENCE TO RELATED APPLICATIONS

This application is based on and claims the benefit of priority from prior Japanese Patent Application No. 2008-283230, filed on Nov. 4, 2008, the entire contents of which are incorporated herein by reference.

BACKGROUND OF THE INVENTION

1. Field of the Invention

The present invention relates to a nonvolatile semiconductor memory device that can electrically read data or write data.

2. Description of the Related Art

Some of conventional semiconductor integrated circuits include one-time programmable memory (OTP memory) having relatively small capacity between several Kbits and tens of Kbits. Such an OTP memory is used for various applications such as storing information relating to a semiconductor memory device, a highly-integrated logic circuit, or a high-precision analog circuit formed together on the same chip (the information stored therein includes defect relief information, manufacturing information, adjustment information of circuit characteristics, individual chip intrinsic number, and the like).

As OTP memory employed in the above use, an OTP memory of gate-insulation film destruction type is known (for example, refer to JP2008-171477A). This OTP memory stores information based on whether a gate insulation film of a MOS transistor included in the memory cell is destroyed or not. That is, this memory cell stores "0" data in a state before the gate insulation film of the MOS transistor is destroyed (a high resistance state) while it stores "1" data in a state after the gate insulation film is destroyed (a low resistance state). Based on the electric property before and after the writing, the nonvolatile memory cell of the gate-insulation film destruction type is called an "antifuse element".

This gate-insulation film destruction type antifuse element has the same structure as a normal MOS transistor used in other integrated circuits formed together on the same chip. Thus, a special process is not required to be added to the manufacturing process. Moreover, the production cost is low. Furthermore, since it is characterized in that it does not need any additional production step, it does not suffer from any deterioration of properties of major semiconductor elements mounted in combination on the same chip, such as fine-patterned memory elements for large capacity storage, high-speed transistors contained in high-speed logic circuits, and transistors for analog circuits exhibiting a high-precision electrical property. With these excellent characteristics, the antifuse element may be referred to as an optimal nonvolatile memory element for the above use.

However, there is another problem that must be solved for the use of the antifuse element of the gate-insulation-film destruction type. The problem is caused by a method for storing information used in the antifuse element of the gate-insulation-film destruction type. The method includes a step of destroying the device by applying a high voltage. In general, destruction of the gate insulation film creates a pinhole having a diameter of about 50 nm. However, it is difficult to control a position where the pinhole is created, and a shape thereof. For example, when a pinhole is created in the vicinity of a center of a channel of the transistor, a read current is small in comparison with the case that the pinhole is created in the vicinity of a source or a drain. This can be a cause of false reading of data stored in a memory cell.

As countermeasures of this problem, the channel length of the MOS transistor may be shortened, or amount of overlap between the source/drain diffusion regions and the gate electrode may be increased. But none of these countermeasures are enough for solving the problem. Moreover, a state of the gate insulation film after destruction tends to be unstable.

For example, when destruction of the gate insulation film is not enough, a current at the time of the reading becomes extremely small, or a large reading current is provided at an initial state, but it the current decreases rapidly as the time lapses.

In contrast, when the gate insulation film is destroyed excessively, a crystal structure of silicon just beneath the gate insulation film or a junction structure of the silicon may also be destroyed. This causes a decrease of the read current, and generation of an abnormal leak current. This is regarded as a problem. As a countermeasure for the problem, write a current flowing in the antifuse element after the destruction of the gate insulation film may be controlled. This countermeasure is not enough for solving the problem, either.

In this way, a conventional antifuse element of the gate-insulation-film destruction type does not fully solve a problem about false reading due to the information-storing method thereof.

SUMMARY OF THE INVENTION

An aspect of the present invention provides a nonvolatile semiconductor memory device comprising: a memory cell array including memory cells arranged at intersections of a plurality of word lines and a plurality of bit lines intersecting each other; a row decoder configured to receive a writing instruction signal and a reading instruction signal to selectively activate one of the word lines according to an input state of a row address signal; a data buffer configured to receive a data input signal and drive corresponding one of the bit lines when the writing instruction signal is received, and amplify a minute reading signal transmitted to one of the bit lines to output a data output signal when the reading instruction signal is received; a power supply circuit configured to supply a certain voltage to the memory cell, and, in response to the reading instruction signal, keep the voltage at a ground potential.

Another aspect of the present invention provides A nonvolatile semiconductor memory device comprising: a memory cell array including memory cells arranged at intersections of a plurality of word lines and a plurality of bit lines intersecting each other; a row decoder configured to receive a writing instruction signal and a reading instruction signal to selectively activate one of the word lines according to an input state of a row address signal; a data buffer configured to receive a data input signal and drive corresponding one of the bit lines when the writing instruction signal is received, and amplify a minute reading signal transmitted to one of the bit lines to output a data output signal when the reading instruction signal is received; a plurality of plate lines commonly coupled to the memory cells arranged along a first direction; a plate line drive circuit configured to selectively drive the plate lines according to an output signal of the row decoder; and a power supply circuit configured to supply a boosted voltage, the plate line drive circuit being operative to supply a certain boosted voltage to the plate lines according to the writing instruction signal, the boosted voltage being generated by the power supply circuit, and supply a ground potential to the plate lines according to the read instruction signal.

BRIEF DESCRIPTION OF THE DRAWINGS

FIG. 3A describes a write operation of the OTP memory according to the first embodiment.

FIG. 3B describes a write operation of the OTP memory according to the first embodiment.

FIG. 3C describes a write operation of the OTP memory according to the first embodiment.

FIG. 4D shows a reading operation of the antifuse element 1-1 in the OTP memory according to the first embodiment.

FIG. 4E shows a reading operation in the conventional antifuse element.

FIG. 4F shows a reading operation in the conventional antifuse element.

FIG. 6D describes a write operation of the OTP memory according to the second embodiment.

FIG. 6E describes a write operation of the OTP memory according to the second embodiment.

FIG. 7A shows a reading operation of the antifuse element 1-1 in the OTP memory according to the second embodiment.

FIG. 7B shows a reading operation of the antifuse element 1-1 in the OTP memory according to the second embodiment.

FIG. 13A shows variation in the sectional structure of the antifuse element 1-1' caused by a write operation in the fifth embodiment.

FIG. 13B shows variation in the sectional structure of the antifuse element 1-1' caused by a write operation in the fifth embodiment.

FIG. 13C shows variation in the sectional structure of the antifuse element 1-1' caused by a write operation in the fifth embodiment.

FIG. 14A shows a reading operation of the antifuse element 1-1' of the OTP memory according to the fifth embodiment.

FIG. 14B shows a reading operation of the antifuse element 1-1' of the OTP memory according to the fifth embodiment.

FIG. 14C shows a reading operation of the antifuse element 1-1' of the OTP memory according to the fifth embodiment.

DETAILED DESCRIPTION OF THE EMBODIMENTS

Figure 1:
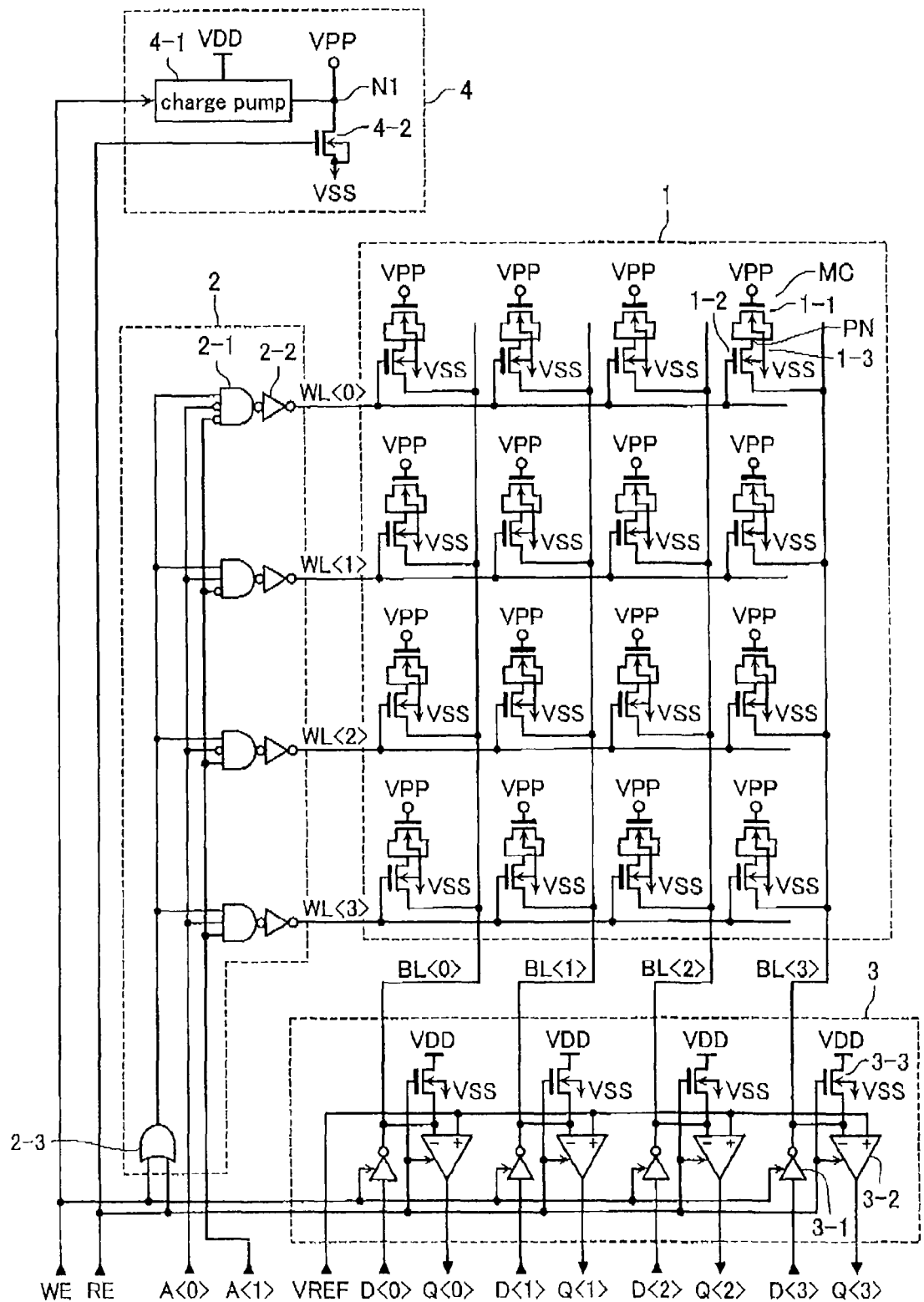
FIG. 1 is a circuit diagram showing the entire structure of the OTP memory using the antifuse element according to the first embodiment of the present invention.

Hereinafter, embodiments of the present invention will be described in detail with referent to the drawings.

First Embodiment

A circuit diagram showing the entire structure of the OTP memory using the antifuse element in accordance with the first embodiment of the present invention is illustrated in FIG.

1. The OTP memory of this first embodiment includes a memory cell array 1, a row decoder 2, a data buffer group 3 and a power supply circuit 4.

The memory cell array 1 includes memory cells MC having an antifuse element. The memory cells MC are arranged in a grid-like pattern at intersections (sixteen intersections) of word lines WL<0>-WL<3> and bit lines BL<0>-BL<3> intersecting each other. Herein, a memory cell array 1 of 4*4=16 bits is illustrated as an example for simplicity of explanation. But it is needless to say that the present invention is not limited to this.

Each of the memory cells MC arranged in a grid pattern in the memory cell array 1 comprises an antifuse element 1-1 composed of an NMOS transistor, and a selection gate 1-2 composed of an NMOS transistor. The gate electrodes of the antifuse elements 1-1 are connected in common to a node N1 of the power supply circuit 4. A source and a drain of the antifuse element 1-1 are defined as a program node PN, and are connected to a drain of the selection gate 1-2. The gate electrodes of the selection gates 1-2 of the plurality of memory cells MC arranged along the same row is connected in common to one word line WL<i> (i=0-3), respectively. Moreover, the source electrodes of the selection gates 1-2 of the plurality of memory cells arranged along the same column are connected in common to one bit line BL<j> (j=0-3), respectively.

Note that because a P type substrate is often used for production of the latest integrated circuit, the antifuse element 1-1 composed of an NMOS transistor and the bulk electrode 1-3 of the selection gate 1-2 are usually connected in common to a 0 V power supply (VSS).

The row decoder 2 receives a reading instruction signal RE, and selectively activates one word line WL from among four word lines WL<0>-WL<3> according to a state of a row address signal A<0> and A<1>.

A specific structure of the row decoder 2 is described with reference to FIG. 1. The row decoder 2 comprises four pairs of word line selection logic circuits 2-1 and word line driver circuits 2-2 that are connected to the four word lines WL<0>-WL<3>, respectively. In addition, it includes an OR gate 2-3.

An example of the word line selection logic circuit 2-1 is a multiple-input NAND logic circuit. One of its input terminal is provided with an output signal of the OR gate 203. The OR gate 2-3 outputs an OR-logic output signal based on a write instruction signal WE and the read instruction signal RE as its input. The other two input terminals of the circuit 2-1 are provided with address signals A<0> and A<1>, respectively. The address signals A<0> and A<1> are fed to the word line selection logic circuit 2-1 after being inverted or not inverted, thereby any one of the word lines being selected based on the state of the address signals.

The output terminal of the word line selection logic circuit 2-1 is connected to an input terminal of the word line driver circuit 2-2 composed of an inverter. The word line driver circuit 2-2 inverts the input signal, and drives one of the word lines WL<0>-WL<3>.

Moreover, the data buffer group 3 receives the write instruction signal WE and 4-bit data input signals D<0>-D<3> to drive the four bit lines BL<0>-BL<3>, respectively.

Moreover, on receiving the read instruction signal RE, the data buffer group 3 amplifies minute reading signals transmitted to the four bit lines BL<0>-BL<3>, respectively, and outputs 4-bit data output signals Q<0>-Q<3>.

The data buffer group 3 includes four data buffers each connected to one of the bit lines BL<0>-BL<3>. Each of the data buffers includes a write buffer 3-1, a sense amplifier 3-2, and a bit line bias circuit 3-3.

When the writing instruction signal WE is provided, the write buffer 3-1 receives data input signals D<0>-D<3>, and drives the bit lines BL<0>-BL<3>.

The sense amplifier 3-2 amplifies a minute potential difference between a voltage emerged at one of the bit lines BL<0>-BL<3> and a reference potential VREF when the reading instruction signal RE is provided thereto, and the amplified signal is provided as data output signals Q<0>-Q<3>.

Moreover, the bit line bias circuit 3-3 is configured by one NMOS transistor. The power supply voltage VDD is provided to a drain of the NMOS transistor. The source of the NMOS transistor is connected to one input terminal of the sense amplifier 3-2. Moreover, the gate of the NMOS transistor is provided with the reading instruction signal RE. The bit line bias circuit 3-3 thereby injects the bias current necessary for a sense operation to the bit line BL<0>-BL<3> when the reading instruction signal RE is provided.

The power supply circuit 4 comprises a charge pump circuit 4-1, and ground potential clamping circuit 4-2. The charge pump circuit 4-1 receives the writing instruction signal WE, and amplifies the power supply voltage VDD to boost the voltage VPP of the node N1 to around 6 V. Moreover, the VSS clamping circuit 4-2 comprises one NMOS transistor. A drain thereof is connected to the node N1, and the source thereof is connected to a ground terminal fixed at the ground potential VSS, and the reading instruction signal RE is supplied to its gate.

Accordingly, the ground potential clamping circuit 4-2 receives the reading instruction signal RE to keep a potential of the node N1 during a reading operation at the ground potential VSS. The potential of the node N1 is supplied in common to plate electrodes of all the antifuse elements 1-1, or gate electrodes of the NMOS transistors.

Figure 2A:
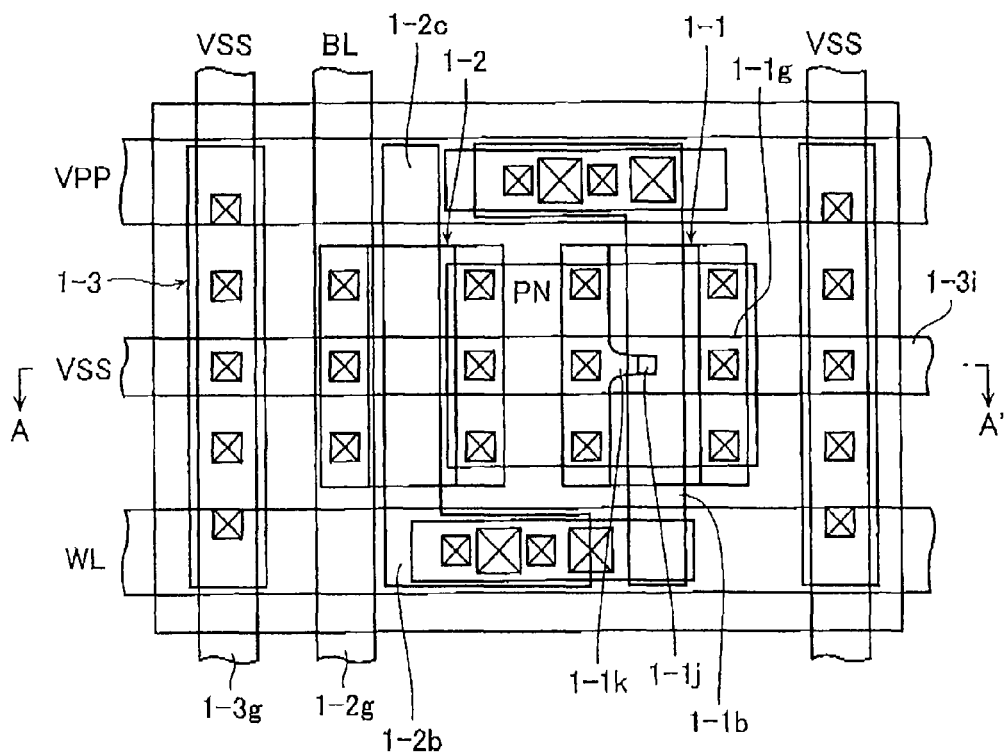
FIG. 2A is a plan view explaining, as an example, a specific structure of the memory cell MC (an antifuse element 1-1, a selection gate 1-2, a bulk electrode 1-3) according to the first embodiment of the present invention.
Figure 2B:
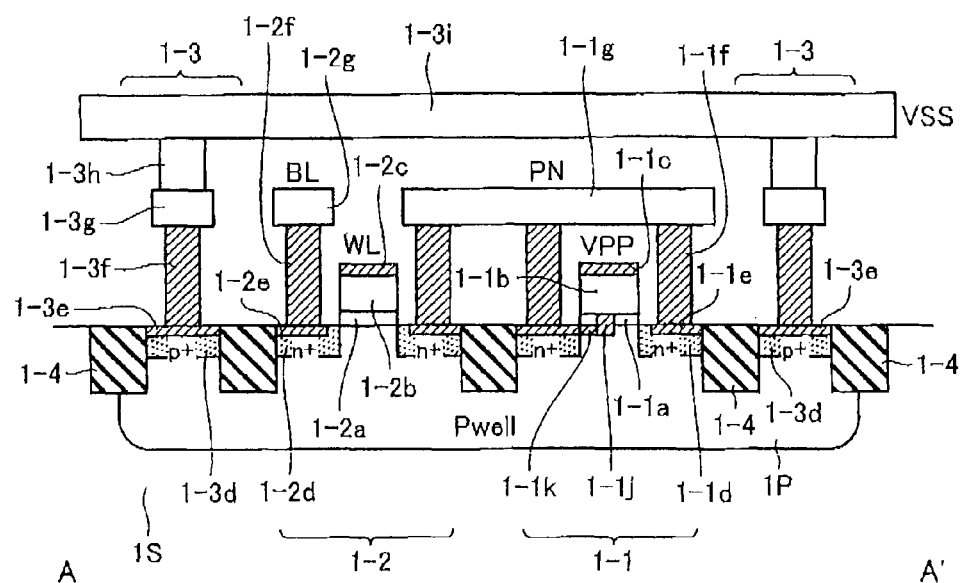
FIG. 2B is a sectional view explaining, as an example, a specific structure of the memory cell MC (an antifuse element 1-1, a selection gate 1-2, a bulk electrode 1-3) according to the first embodiment of the present invention.

With reference to FIG. 2A and FIG. 2B, a specific structure of the memory cell MC (an antifuse element 1-1, a selection gate 1-2, and a bulk electrode 1-3) is described as an example. FIG. 2A is a plan view of the memory cell MC, and FIG. 2B is an A-A' sectional view of FIG. 2A.

The antifuse element 1-1 and the selection gate 1-2 are NMOS transistors formed in a P type well 1P, the P type well being formed on a P type substrate. Note that both FIG. 2A and FIG. 2B show a state after the gate insulation film of the antifuse element 1-1 is destroyed.

That is, the antifuse element 1-1 is a normal NMOS transistor, and includes a gate insulation film 1-1a and a gate electrode 1-1b formed of polysilicon, both of which are laminated sequentially on the P type well 1P. A silicide layer 1-1c, which is a compound of silicon and metal, is laminated on the surface of the gate electrode 1-1b to suppress the resistance of the gate electrode 1-1b. An N+ type diffusion layer 1-1d serving as the source/drain region of the NMOS transistor is formed on the surface of the P type well 1P at both ends of the gate electrode 1-1b.

A contact 1-1f is formed through a silicide layer 1-1e on the N+ type diffusion layer 1-1d forming a source/drain region. A wiring layer 1-1g is formed as a wiring layer to short-circuit the contacts 1-1f. This wiring layer 1-1g is connected to the selection gate 1-2 as described below.

The selection gate 1-2 is formed of a normal NMOS transistor. It includes a gate insulation film 1-2a and a gate electrode 1-2b formed of polysilicon laminated sequentially on the P type well 1P. A silicide layer 1-2c is laminated on the surface of the gate electrode 1-2b to suppress the resistance of the gate electrode 1-2b. The silicide layer 1-2c includes a compound of metal and silicon. An N+ type diffusion layer 1-2d as a source/drain region of the NMOS transistor is formed in the region of the P type well 1P at both ends of the gate electrode 1-2b.

On the N+ type diffusion layer 1-2d as a source/drain region, contacts 1-2f are formed through a silicide layer 1-2e. The above-mentioned wiring layer 1-1g is connected to one of the contacts 1-2f at the drain side, and a wiring layer 1-2g as a bit line BL is connected to the other contact 1-2f at the source side.

Moreover, the bulk electrode 1-3 comprises a type diffusion layer 1-3d formed on the P type well 1P, a silicide layer 1-3e formed on this P+ type diffusion layer 1-3d, a contact 1-3f for short-circuiting, a wiring layer 1-3g, a contact 1-3h, and wiring layer 1-3i.

Therefore, the P type well 1P in which two transistors as the antifuse element 1-1 and the selection gate 1-2 are formed is thereby fixed to the ground potential VSS. Note that the antifuse element 1-1, the selection gate 1-2 and the bulk element 1-3 together form one memory cell MC. These elements are formed together on one of the P type wells 1P. Trench insulation films 1-4 are formed between these elements to electrically isolate these elements.

The antifuse element 1-1 in FIG. 2B illustrates a state after "1" data is written, i.e., a state after the gate insulation film 1-1a is destroyed. In general, a destructed part in the gate insulation film 1-1a is a pinhole 1-1j with about 50 nm in diameter. At the time of writing, a relatively large current concentrates towards the pinhole 1-1j. Then, a metal atom laminated in the silicide layer 1-1e on the source electrode or the drain electrode (N+ type diffusion layer 1-1d) moves along the current path. The movement of the metal atom causes an electric conduction path 1-1k to be formed between the source electrode or the drain electrode (the N+ type diffusion layer 1-1d) and the pinhole 1-1j, Because the pinhole 1-1j and the conduction path 1-1k remains unchanged even after the completion of write operation, these antifuse element 1-1 maintains a low resistance state even after application of the breakdown voltage is terminated (an irreversible write operation is performed therein).

Next, a write operation of the OTP memory according to the first embodiment is described with reference to FIG. 3A-FIG. 3E.

FIG. 3A shows voltages applied during the initial stand-by state. In this initial stand-by state, the selection gate 1-2 is in a nonconductive state, and, therefore, a source and drain of the antifuse element 1-1 (program node PN) are set to a high impedance state. Moreover, the voltage applied to the gate electrode 1-1b is 0 V, and the P type well 1P is provided with a voltage of 0 V. The gate insulation film 1-1a is not destroyed at this stage, and has a good insulation property. In this early stand-by state, a leak current hardly flows.

Then, the writing instruction signal WE shown in FIG. 1 is provided, and the charge pump circuit 4-1 is activated, thereby the potential VPP of the node N1 is boosted to a voltage necessary for write operation, e.g., 6 V. Due to electrostatic induction of the gate electrode 1-1a applied with a high voltage, electrons in the channel region (the P type well 1P) of the antifuse element 1-1 gather, thereby an N-type inversion layer 1-1m being formed. However, the source and the drain that are in contact with the inversion layer 1-1m (N+ type diffusion layer 1-1d, the program node PN) is in a high impedance state (HiZ), because the selection gate 1-2 is in a nonconductive state. Accordingly, in this state, the gate insulation film 1-1a is not destroyed.

After that, as shown in FIG. 3C, the memory cell MC shifts to a writing state. That is, the word line WL is activated, the selection gate 1-2 is turned on, and the bit line BL is driven to 0 V, and the program node PN is provided with a voltage of 0 V, and this state is maintained for a while.

Figure 3D:
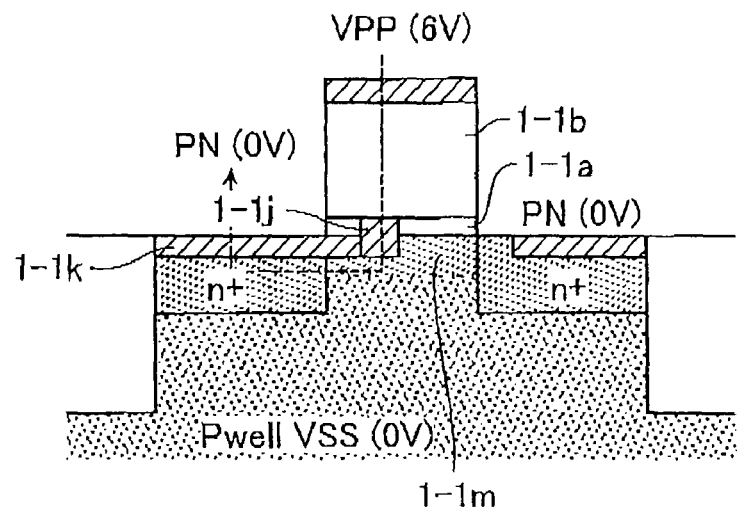
FIG. 3D describes a write operation of the OTP memory according to the first embodiment.

Then, as shown in FIG. 3D (a breakdown state), a pinhole 1-1j of about 50 nm in diameter is created in the gate insulation film 1-1a. A relatively large write current thereby flows, as shown in FIG. 3D by a broken line, along a path that leads to the program node PN (0 V) through the pinhole 1-1j from the gate electrode 1-1b. The write current moves metal included in the silicide layer 1-1k thereby forming an electric conduction path that leads to the pinhole 1-1j.

Figure 3E:
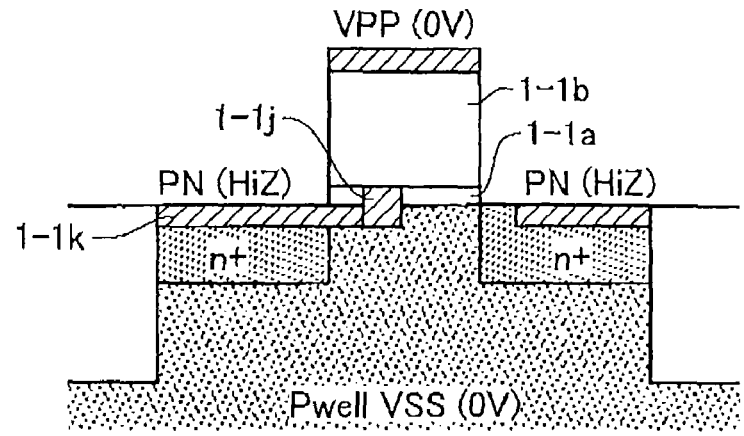
FIG. 3E describes a write operation of the OTP memory according to the first embodiment.

After such an electric conduction path is once formed, the electric conduction path never disappear, even if the potential of the gate electrode 1-1b is returned to 0 V as shown in FIG. 3E (a stand-by state after writing). That is, FIG. 3E illustrates a state after writing of the antifuse element.

Figure 4A:
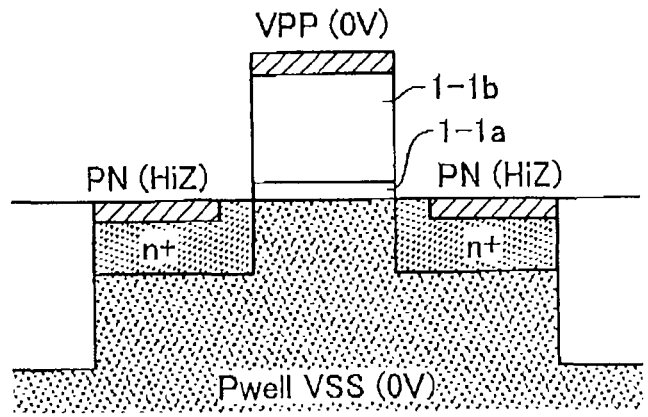
FIG. 4A shows a reading operation of the antifuse element 1-1 in the OTP memory according to the first embodiment.
Figure 4B:
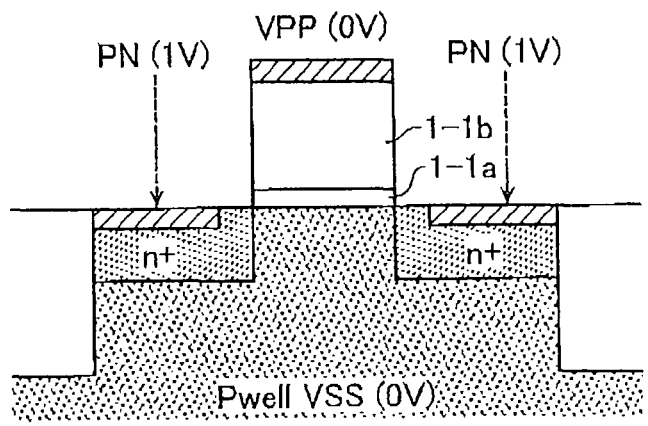
FIG. 4B shows a reading operation of the antifuse element 1-1 in the OTP memory according to the first embodiment.

Then, a reading operation of the antifuse element 1-1 is shown in FIG. 4A-FIG. 4D. FIG. 4A illustrates a reading stand-by state in the memory cell MC ("0" cell) where "0" data is written. FIG. 4B illustrates a reading state in the "0" cell.

Figure 4C:
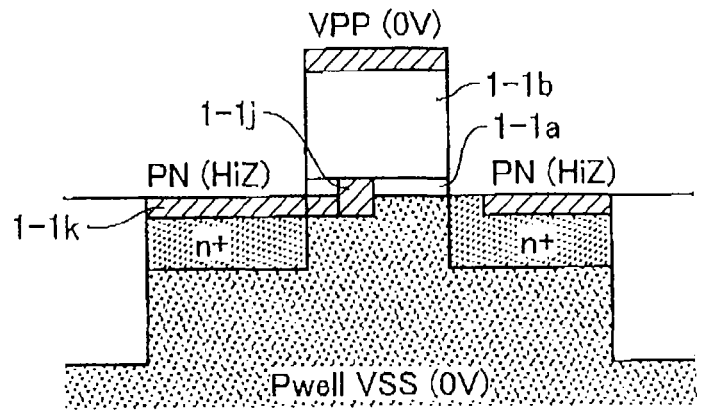
FIG. 4C shows a reading operation of the antifuse element 1-1 in the OTP memory according to the first embodiment.

Moreover, FIG. 4C illustrates a reading stand-by state in the memory cell MC ("1" cell) where "1" data is written. FIG. 4D illustrates a reading state in the "1" cell.

In the reading stand-by state in the "0" cell shown in FIG. 4A and the reading stand-by state in the "1" cell shown in FIG. 4C, the potential VPP of the node N1 is set to 0 V, while the bulk electrode 1-3 (the P type well 1P) is also biased to 0 V.

Moreover, since the selection gate 1-2 is in a non-conductive state, the source and the drain of the antifuse element 1-1 (the program node PN) are in a high-impedance state (HiZ).

Thus, irrespective of existence or non-existence of the pinhole 1-1j in the gate insulation film 1-1a, the current does not flow in the antifuse element 1-1.

Next, in an actual reading operation, the selection gate 1-2 is turned on by activating the word line WL. Also, a minute bias current is injected into the bit line BL by activating the bit line bias circuit 3-3. Then, in the antifuse element 1-1 in which the gate insulation film 1-1a is not destroyed ("0" cell, FIG. 4B), a potential of the program node PN rises nearly to the power supply voltage VDD (1 V).

On the other hand, in the antifuse element 1-1 in which the gate insulation film 1-1a is destroyed and a pinhole 1-1b is formed ("1" cell, FIG. 4D), a read current flows from the bit line BL towards the gate electrode 1-1b biased at 0 V. Thus, a potential in the program node PN remains at a relatively low potential (e.g., 0.2 V).

In this case, a leak current is expected to flow towards the P type well 1P that is biased to 0 V. This leak current is caused by the crystal defect generated just beneath the conduction path created by movement of metal from the silicide layer 1-1e, or just beneath the pinhole 1-1j. The leak current may be also caused by the destruction of the junction between the N+ type diffusion region 1-1d of the antifuse element 1-1 and the P+ type diffusion region 1-3d of the bulk electrode 1-3 (see FIG. 4D).

However, even if such a leak current occurs, a reading current flowing through the program node PN does not decrease due to the influence of the leak current. This is because the gate electrode 1-1b is biased to 0 V by the power supply circuit 4.

Figure 4G:
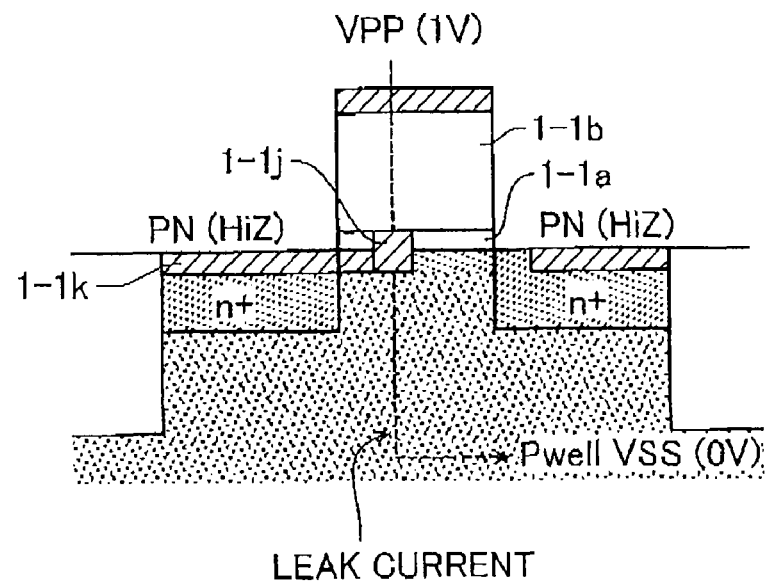
FIG. 4G shows a reading operation in the conventional antifuse element.
Figure 4H:
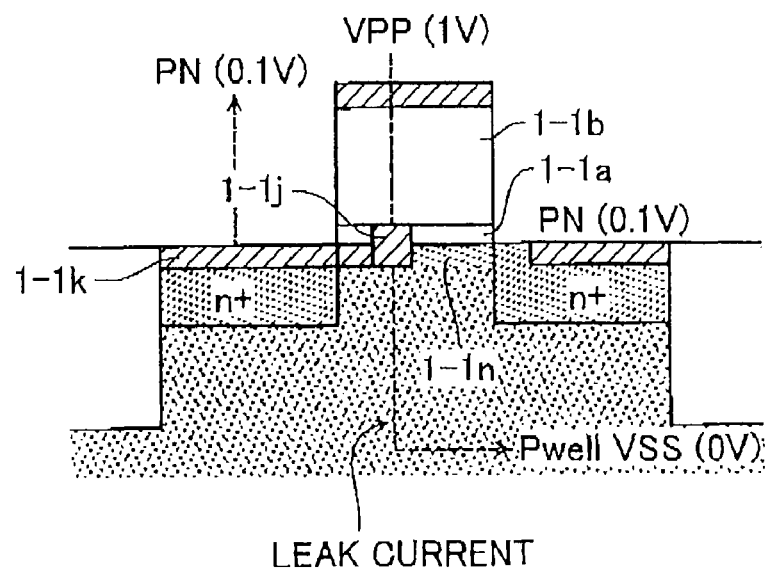
FIG. 4H shows a reading operation in the conventional antifuse element.

Here, with reference to FIG. 4E-FIG. 4H, a reading operation in the conventional antifuse element is explained, and it is compared with the operation of the antifuse element 1-1 of the first embodiment. FIG. 4E shows a reading stand-by state in the "0" cell, and FIG. 4F shows a reading state in the "0"

cell. FIG. 4G shows a reading stand-by state in the "1" cell. FIG. 4H shows a reading state in the "1" cell.

Prior to a reading operation, the voltage VPP provided to the gate electrode 1-1b is set to such a low voltage that the gate insulation film 1-1a is not destroyed, e.g., 1 V. Then, an N-type inversion layer 1-1n is formed, by electrostatic induction of the gate electrode 1-1a, in the channel region of the antifuse element 1-1. At this point, the bulk electrode 1-3 or the P type well 1P is biased at 0 V. In addition, the program node PN is in a high impedance state (HiZ), because the selection gate 1-2 is in a non-conductive state.

In the "0" cell where the gate insulation film 1-1a is not destroyed, the gate insulation film 1-1a serves as a barrier as shown in FIG. 4F, and no current flows therethrough.

In contrast, in the "1" cell where the pinhole 1-1j is formed in the gate insulation film 1-1a, electric charges are supplied through a current path (from the gate electrode 1-1b, through the pinhole 1-1j, to the conduction path 1-1k) shown in a broken line of FIG. 4H. It is expected that the potential of the program node PN is kept at a high potential.

However, through the crystalline defect and the junction destruction, a part of the leak current or the most of the leak current flows to the bulk electrode 1-3 that is biased at 0 V.

This leak current may reduce a reading current that is expected to flow in the program node PN. Therefore, the potential of the program node PN is not kept at a high potential, i.e. falls to 0.2 V, for example.

In this case, the distinction of the "0" cell and the "1" cell becomes difficult in the sense amplifier circuit.

On the other hand, in the first embodiment, the potential of the gate electrode 1-1b of the antifuse element 1-1 is kept at 0 V at the time of a reading operation. Therefore, a reading current from the memory cell MC does not deteriorate even if a crystal defect or junction destruction occurs in the memory cell MC. This allows the OTP memory to correctly read data stored in the memory cell MC.

Second Embodiment

Next, the OTP memory using the antifuse element according to second embodiment of the present invention is described with reference to FIG. 5 and FIG. 6. The same constituents as that of the first embodiment are denoted with the same reference numerals and omitted from the following detailed description. The entire structure of the circuit is similar to that of the first embodiment (FIG. 1). However, in the first embodiment, an NMOS transistor (normally-off) of the enhancement type is used for the antifuse element 1-1. In contrast, an depression-type NMOS transistor (normally-on) is used for the antifuse element 1-1 in this second embodiment.

When the NMOS transistor of the depression type is used for the antifuse element 1-1, the number of steps increases by a few steps in a manufacturing process, and this is a disadvantage in the production.

However, regarding the characteristic of the device, the writing/reading property of the antifuse element 1-1 can be improved in comparison with the first embodiment.

Figure 5A:
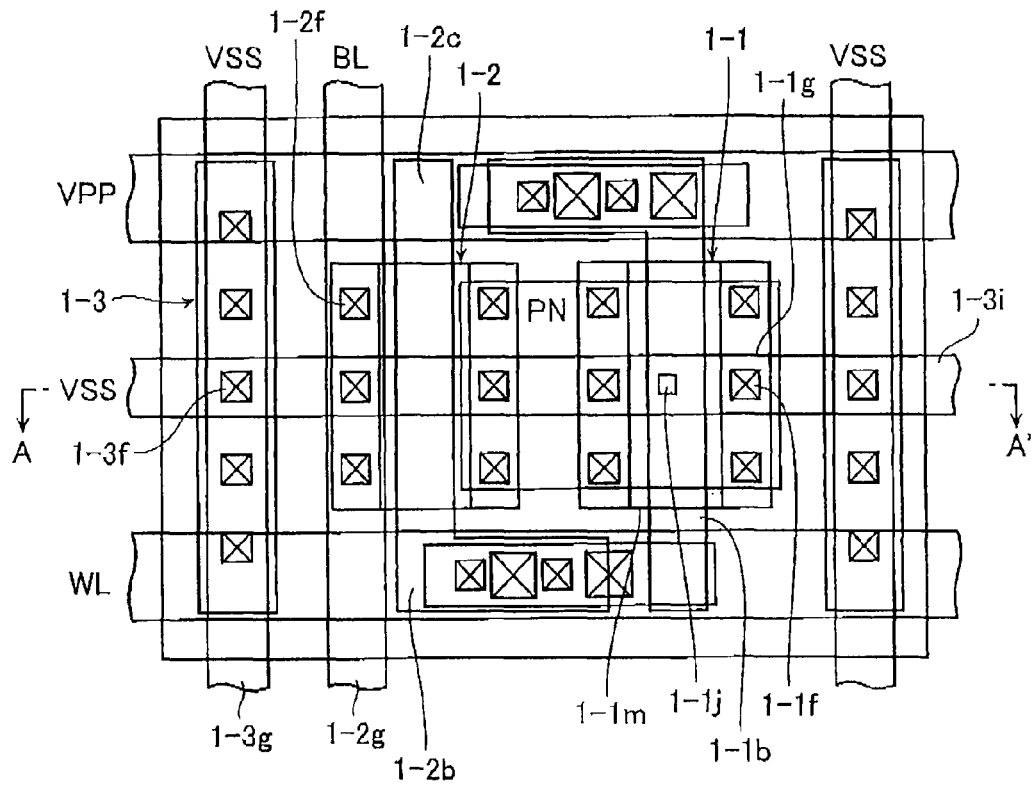
FIG. 5A is a plan view explaining, as an example, a specific structure of the memory cell MC (an antifuse element 1-1, a selection gate 1-2, a bulk electrode 1-3) according to the second embodiment of the present invention.
Figure 5B:
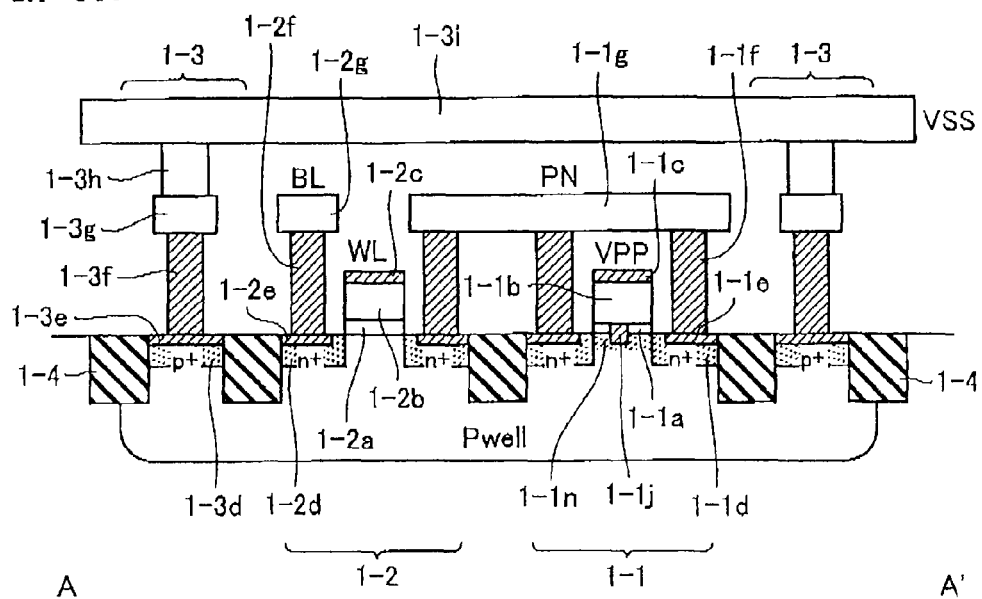
FIG. 5B is a sectional view explaining, as an example, a specific structure of the memory cell MC (an antifuse element 1-1, a selection gate 1-2, a bulk electrode 1-3) according to the second embodiment of the present invention.
Figure 6A:
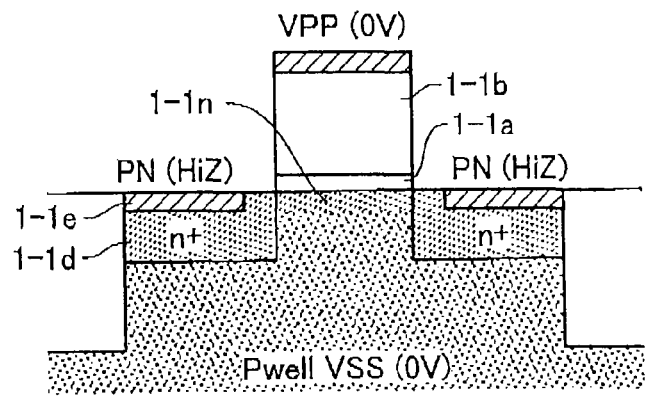
FIG. 6A describes a write operation of the OTP memory according to the second embodiment.

A plan view of the memory cell MC comprising the antifuse element 1-1 formed of a depression type NMOS transistor, the selection gate 1-2, the bulk electrode 1-3 is shown in FIG. 5A. Moreover, FIG. 5B is an A-A' sectional view of FIG. 5A.

The plan view of FIG. 5A is substantially the same as that of the first embodiment (FIG. 2A). In the antifuse element 1-1 formed of a depression-type NMOS transistor, impurity implantation process is conducted for a channel region thereof. Accordingly, an inversion layer 1-1n is formed in the channel region even when a potential difference is not provided among the gate electrode 1-1b, the type diffusion layer 1-1d, and the bulk electrode 1-3 (normally-on). Because of this inversion layer 1-1n, when the pinhole 1-1j is formed in the gate insulation film 1-1 by a write operation, a conduction path that leads from the gate electrode 1-1b, via the pinhole 1-1j and the inversion layer 1-1n, to the N+ type diffusion layer 1-1d is provided. In other words, the conduction path is formed, and the memory cell can be read as "1" cell, even if metal forming the silicide layer 1-1e on the surface of the N+ type diffusion layer 1-1d does not move to the channel direction. Thus, it is not necessary to flow a large current at the time of writing as compared to a case where the NMOS transistor of the enhancement-type is used as an antifuse element. After the writing operation, the cell may have a stable reading current characteristic.

A write operation of the OTP memory according to the second embodiment is described with reference to FIG. 6A to FIG. 6E. FIG. 6A to FIG. 6E show the state of the variation of the sectional structure of the antifuse element 1-1 during the write operation in the second embodiment.

First, in the initial standby state in which a voltage applied to the gate electrode 1-1b is 0 V, the program node PN is in a high impedance state and the P-type well 1P is biased to a ground potential VSS, the gate insulation film 1-1a is not destroyed, and shows a good insulation property. In this condition, a leak current is very small. Note that, in the initial standby state, the inversion layer 1-1n is already formed in the antifuse element 1-1 of the depression type NMOS transistor.

Figure 6B:
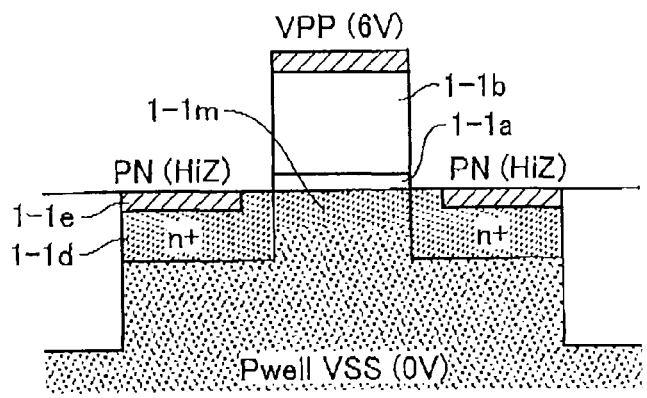
FIG. 6B describes a write operation of the OTP memory according to the second embodiment.
Figure 6C:
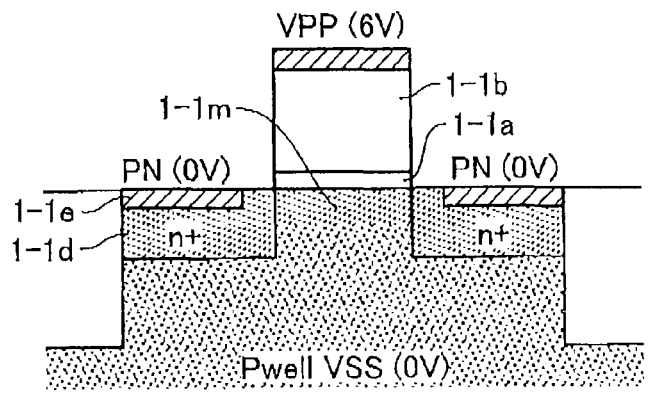
FIG. 6C describes a write operation of the OTP memory according to the second embodiment.

After that, a Voltage VPP of the gate electrode 1-1b is boosted to 6 V (FIG. 6B). An inversion layer 1-1m formed therein has a depth larger than the inversion layer 1-1n in FIG. 6A. In addition, the word line WL is activated, and the selection gate 1-2 shifts to a conductive state. The voltage of the program node PN is set to 0 V, and it shifts to a write mode (FIG. 6C). These operations are almost the same as the first embodiment (FIG. 3B, FIG. 3C).

The breakdown state that occurs next is different from the first embodiment in the following point. Specifically, if a writing state is kept for a certain interval, a pinhole 1-1j of about 50 nm in diameter is created in the gate insulation film 1-1a. Then, a writing current flows, as indicated by broken line, along a path from the gate electrode 1-1b where the voltage VPP (6V) is applied, via the pinhole 1-1j, to the program node PN (0 V).

This writing current may be smaller than that of the first embodiment. This is because it is not necessary to move metal from the silicide layer 1-1e formed on the surface of the N+-type diffusion layer 1-1d. Moreover, because the diameter of the pinhole 1-1j is as small as 50 nm, even a small writing current can provide enough current densities therein to make the gate insulation film 1-1a change its quality.

The conduction path formed in this way does not disappear, even if the voltage VPP of the gate electrode 1-1b is returned to 0 V as shown in FIG. 6E. Moreover, movement of metal formed in the silicide layer 1-1e is not necessary. Accordingly, it does not damage the periphery of the pinhole 1-1j, and thus the electric characteristic of the conduction path may be stable.

Figure 7C:
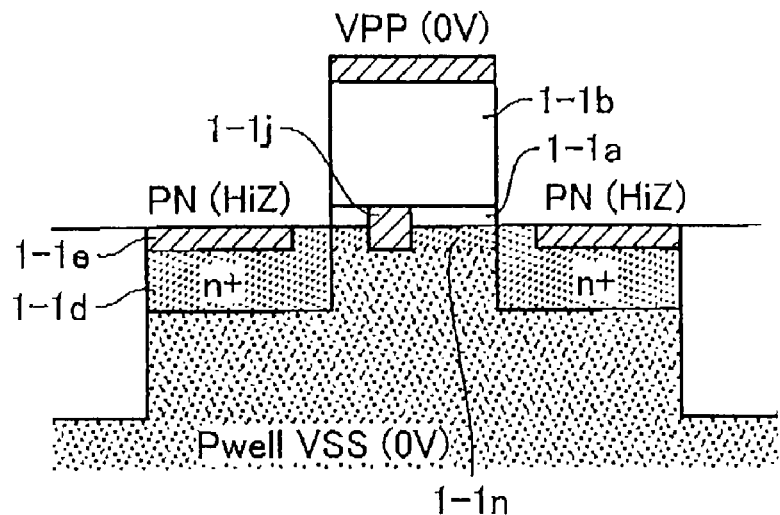
FIG. 7C shows a reading operation of the antifuse element 1-1 in the OTP memory according to the second embodiment.
Figure 7D:
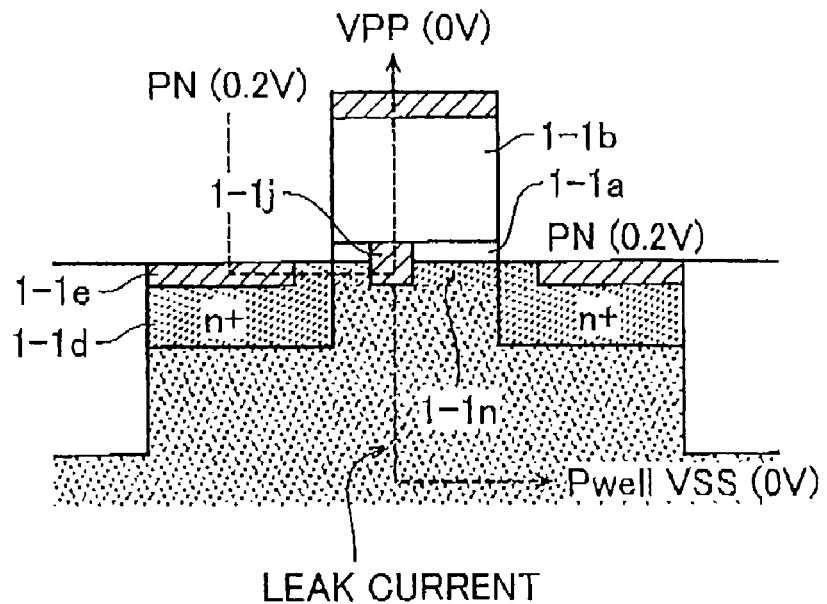
FIG. 7D shows a reading operation of the antifuse element 1-1 in the OTP memory according to the second embodiment.

Referring now to FIGS. 7A-7D, a reading operation of the antifuse element 1-1 of this second embodiment is explained. FIG. 7A shows a reading stand-by state in the "0" cell, and FIG. 7S shows a reading state in the "0" cell. Moreover, FIG. 7C shows a reading stand-by state in the "1" cell, and FIG. 7D shows a reading state in the "1" cell.

In the reading stand-by state in the "0" cell (FIG. 7A) and the reading stand-by state in the "1" cell (FIG. 7C), the potential VPP of the node N1 is biased at 0 V and the bulk electrode 1-3 and the P type well 1P are also biased to 0 V. Because the selection gate 1-2 is in a non-conductive state, the program node PN is a high impedance state (HiZ). Accordingly, irrespective of existence or non-existence of the pinhole 1-1*j* in the gate insulation film 1-1*a*, the leak current flowing through the node N1 and the program node PN does not occur. Note that, even in a biased state in FIG. 7A and FIG. 7C, the inversion channel 1-1*n* is already formed below the gate insulation film 1-1*a*.

Then, in an actual reading operation, the selection gate 1-2 is set to a conductive state by activating the word line WL. In addition, a minute bias current is injected to the bit line BL by activating the bit line bias circuit 3-3. Then, in the antifuse element 1-1 as the "0" cell, the program node PN almost rises to a power supply voltage VDD (1 V).

On the other hand, in the antifuse element 1-1 as the "1" cell, a reading current flows towards the gate electrode 1-1 that is biased at 0 V, and then the potential of the program node PN shifts to a relatively low potential (e.g., 0.2 V).

In this case, in a reading operation for the "0" cell, the potential of the program node PN rises to around 1 V whereas the potential VPP of the gate electrode 1-1*b* is 0 V. Accordingly, an inversion layer channel 1-1*n* pinches off near the N+ type diffusion layer 1-1*d*. This means a conduction path will be cut off. However, this does not provide a bad influence to the reading operation for the "0" cell.

On the other hand, in a reading operation for the "1" cell, the potential of the program node PN is kept around 0.2V, and the inversion layer 1-1*n* does not pinch off. Therefore, a conduction path from the N+ type diffusion layer 1-1*d*, through the inversion layer 1-1*n* and the pinhole 1-1*j*, to the gate electrode 1-1*b* is maintained.

In this case, a leak current is expected to flow towards the P type well 1P that is biased to 0 V. This leak current is caused by the crystal defect generated just beneath the pinhole 1-1*j*, or the destruction of the junction between the N+ type diffusion region 1-1*d* and the P+ type diffusion region 1-3*d* of the bulk electrode 1-3.

However, even if such a leak current occurs, a reading current flowing through the program node PN does not decrease due to the influence of the leak current. This advantage is similar to that of the first embodiment.

As discussed above, according to the first embodiment, even if unexpected crystalline defect or junction destruction occurs caused by writing to the antifuse element, an operation current at the time of data reading does not increase, or the reading current from a memory cell does not deteriorate. Accordingly, it is possible to provide an OTP memory that can correctly read data stored in a memory cell.

Moreover, the current necessary at the time of writing may be suppressed by using a depression-type NMOS transistor as an antifuse element. Therefore, reduction of the layout size of the selection gate 1-2 and the power supply circuit 4 is possible, in comparison with the first embodiment. In addition, existence of the inversion layer 1-1*n* stabilizes the characteristics of the reading current. Therefore, the OTP memory with high reliability can be provided at a low cost.

Third Embodiment

Figure 8:
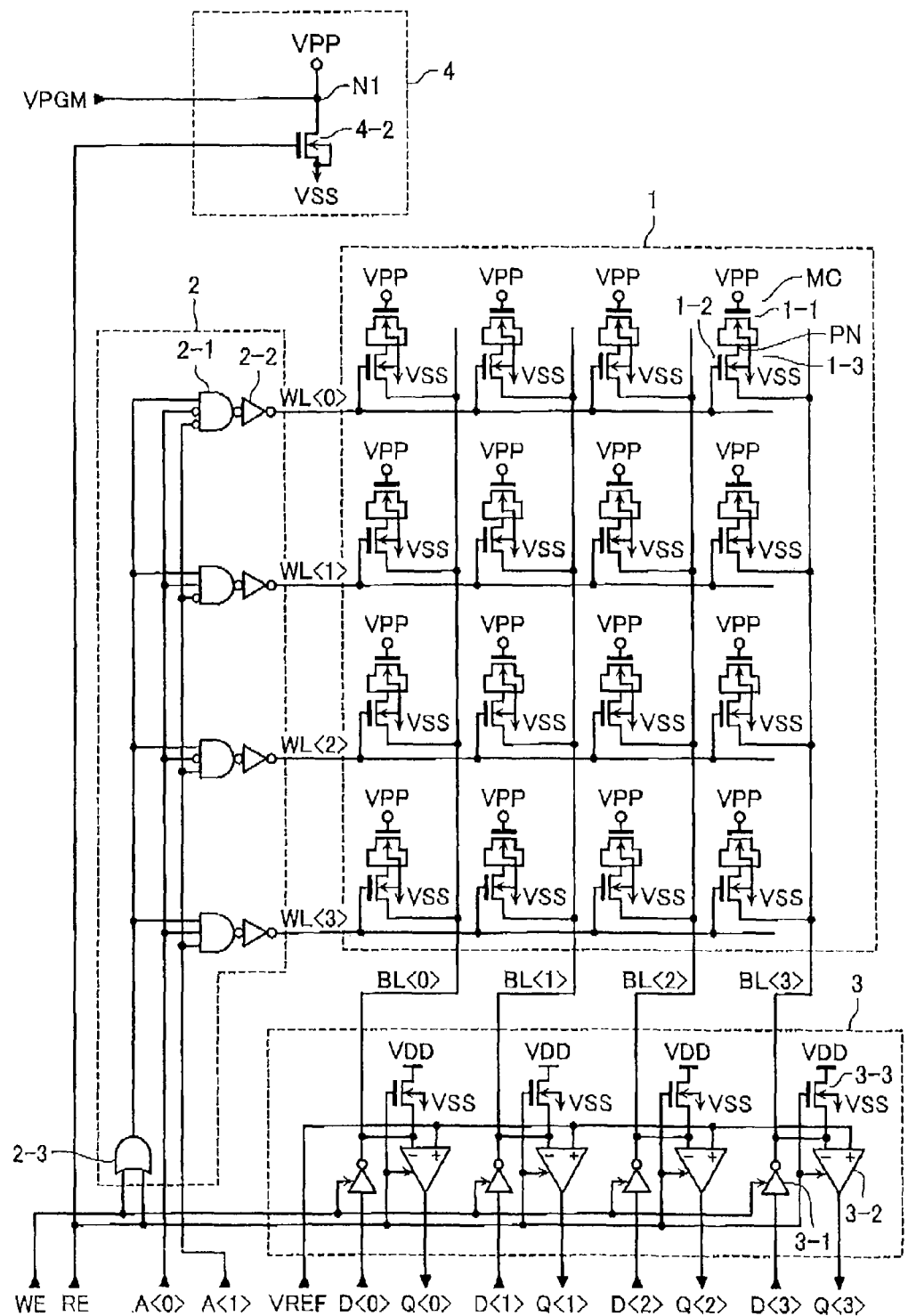
FIG. 8 is a circuit diagram showing the entire structure of the OTP memory using the antifuse element according to the third embodiment of the present invention.

Next, the OTP memory using the antifuse element according to third embodiment of the present invention is described with reference to FIG. 8. FIG. 8 shows entire structure of the OTP memory according to this third embodiment. The same constituents as that of the first embodiment are denoted with the same reference numerals and omitted from the following detailed description.

The third embodiment is different from the first embodiment in structure of the power supply circuit 4. The power supply circuit 4 of the third embodiment comprises only aground potential clamping circuit 4-2. It does not have a charge pump circuit. Instead, a voltage VPGM required for writing is supplied from an external power supply, and is directly supplied to each of the memory cells MC as a potential VPP in the node N1.

The ground potential clamping circuit 4-2 receives the reading instruction signal RE, and sets the potential VPP of the node N1 at a ground potential VSS (0 V). In other words, it has a function of keeping the potential VPP of the node N1 at 0 V at the time of a reading operation. If an external power supply changes the power supply voltage VPGM to 0 V according to the reading instruction signal RE, and has a function of keeping it, the ground potential clamping circuit 4-2 can be omitted.

Since an operation and an advantage of the third embodiment are similar to those of the first embodiment, explanation thereof will be omitted hereinbelow. In addition, according to the third embodiment, the external power supply VPGM may provide a floating state or 0 V except in the write operation. design of power supply circuits may be easy or simple.

Fourth Embodiment

Figure 9:
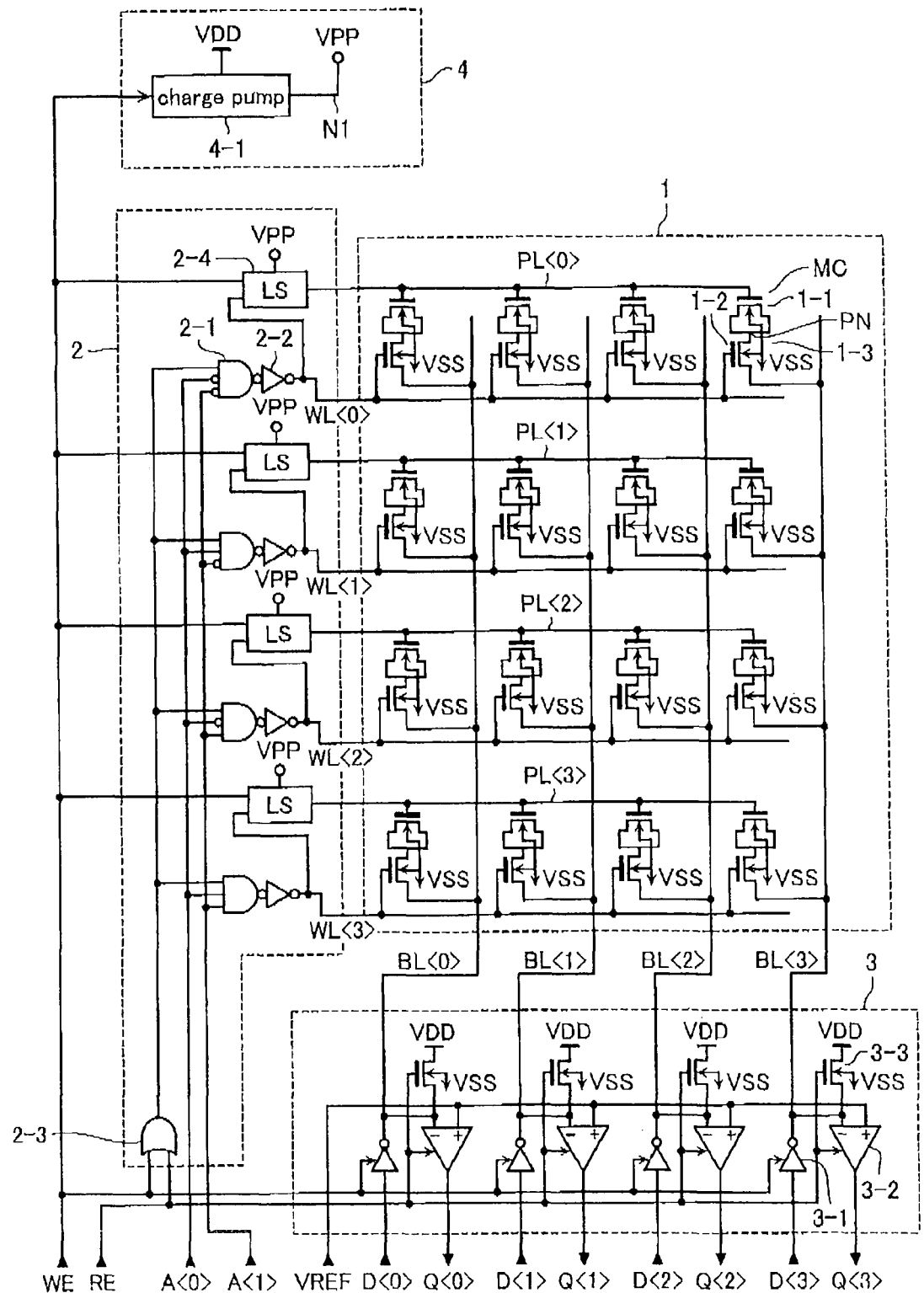
FIG. 9 is a circuit diagram showing the entire structure of the OTP memory using the antifuse element according to the fourth embodiment of the present invention.

Next, the OTP memory using the antifuse element according to the fourth embodiment of the present invention is described with reference to FIG. 9. FIG. 9 shows the entire structure of the OTP memory according to the fourth embodiment. The same constituents as that of the first embodiment are denoted with the same reference numerals and omitted from the following detailed description.

The fourth embodiment is different from the first embodiment in that a plate line drive circuit 2-4 is provided for antifuse elements 1-1 in one row. Each of the plate line drive circuits 2-4 selectively supplies the voltage VPP generated on the power supply circuit 4 to the memory cells MC on the same row via the plate lines PL<0>-<3>, according to the writing instruction signal WE and output signals of the word line WL<0>-WL<3>. Each of the plate lines PL<0>-PL<3> is connected in common to gate terminals of a plurality of the antifuse elements 1-1 arranged in each row.

Figure 10:
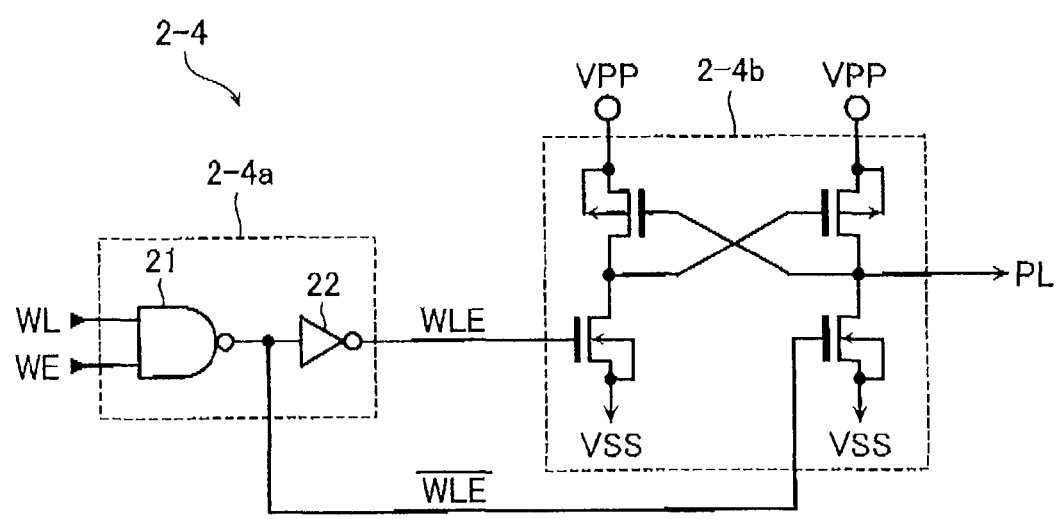
FIG. 10 shows a specific structure of plate line drive circuit 2-4 shown in FIG. 9 as an example.

A specific structure example of each of the plate line drive circuits 2-4 is shown in FIG. 10. This plate line drive circuit 2-4 comprises a plate line logic unit 2-4*a* that operates when it is provided with the power supply voltage VDD, and a plate line drive unit 2-4*b* that operates when it is provided with the potential VPP of the node N1.

The plate line logic unit 2-4*a* comprises a NAND gate 21 with two input terminal, and an inverter 22 that receives an output signal from the NAND gate 21.

The NAND gate 21 receives the writing instruction signal WE and a signal of the word line WL, and outputs a logical product signal of these signals (inverted signal) /WLE. The inverter 22 outputs a non-inverted signal WLE of this logical product signal /WLE.

The plate line drive unit 2-4*b* receives an inverted signal /WLE and a non-inverted signal WLE from the plate line logic unit 2-4*a* to drive each of the plate lines PL.

With this arrangement, the plate line drive circuit 2-4 supplies the boosted voltage VPP (e.g., 6 V) only to the plate line PL located on a row where the word line WL is activated in a write operation. The other plate lines PL are kept at 0 V.

This operation serves to prevent a high voltage from being applied to the memory cell MC that is not to be written, and, therefore, it is possible to prevent false writing. On the other hand, except in the write operation, all of the plate lines are kept at VSS or 0 V.

In this embodiment, the plate line drive circuit 2-4 performs an operation of keeping the plate line PL at 0 V at the time of reading. Thus, as shown in FIG. 9, the power supply circuit 4 used in this embodiment may include nothing but a charge pump circuit 4-1 for generating a boost voltage VPP=6 V necessary at the time of writing. In other words, unlike the above-mentioned embodiments, it is not necessary to provide the ground potential clamp circuit 4-2 for keeping a potential of the node N1 at VSS (0 V) at the time of reading.

In this embodiment, by selectively driving a plurality of plate lines PL, it is possible to suppress the increase of the consumption current at the time of reading operation or in the standby time.

Moreover, in this embodiment, the plate line is kept at VSS or 0 V at the time of reading, and 0 V is provided to the gate electrode of the antifuse element 1-1 at the time of reading.

In this regard, it is similar to the aforementioned embodiment, and an advantage similar to those of the aforementioned embodiment can be obtained.

Fifth Embodiment

Figure 11:
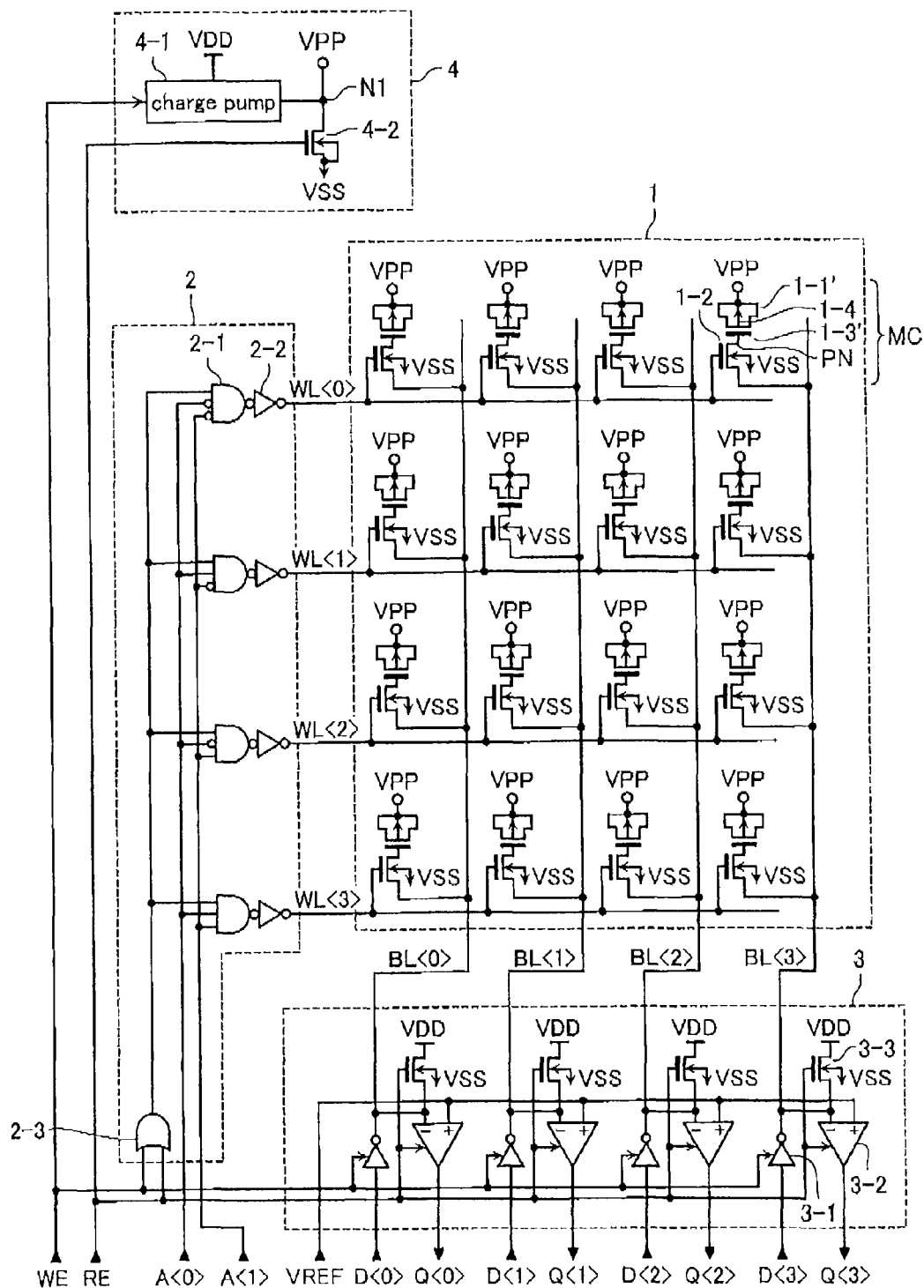
FIG. 11 is a circuit diagram showing the entire structure of the OTP memory using the antifuse element according to the fifth embodiment of the present invention.

Next, the OTP memory using an antifuse element according to the fifth embodiment of the present invention is described with reference to FIG. 11. FIG. 11 shows the entire structure of the OTP memory according to the fifth embodiment. The same constituents as that of the first embodiment are denoted with the same reference numerals and omitted from the following detailed description.

The fifth embodiment includes an antifuse element 1-1' different from that in the first embodiment. In the first embodiment, the NMOS transistor is used for the antifuse element 1-1. In the fifth embodiment, however, a PMOS transistor is used for the antifuse element 1-1'. In accordance with this, the voltage VPP at the node N1 is different from the first embodiment. Also, connection between the node N1 and the selection gate 1-2 is also different. Specifically, the voltage VPP generated in the power supply circuit 4 is supplied to a source and drain of the antifuse element 1-1', and the gate of the antifuse element 1-1' is connected to a drain of the selection gate 1-2. The drain is defined as the program node PN.

Figure 12A:
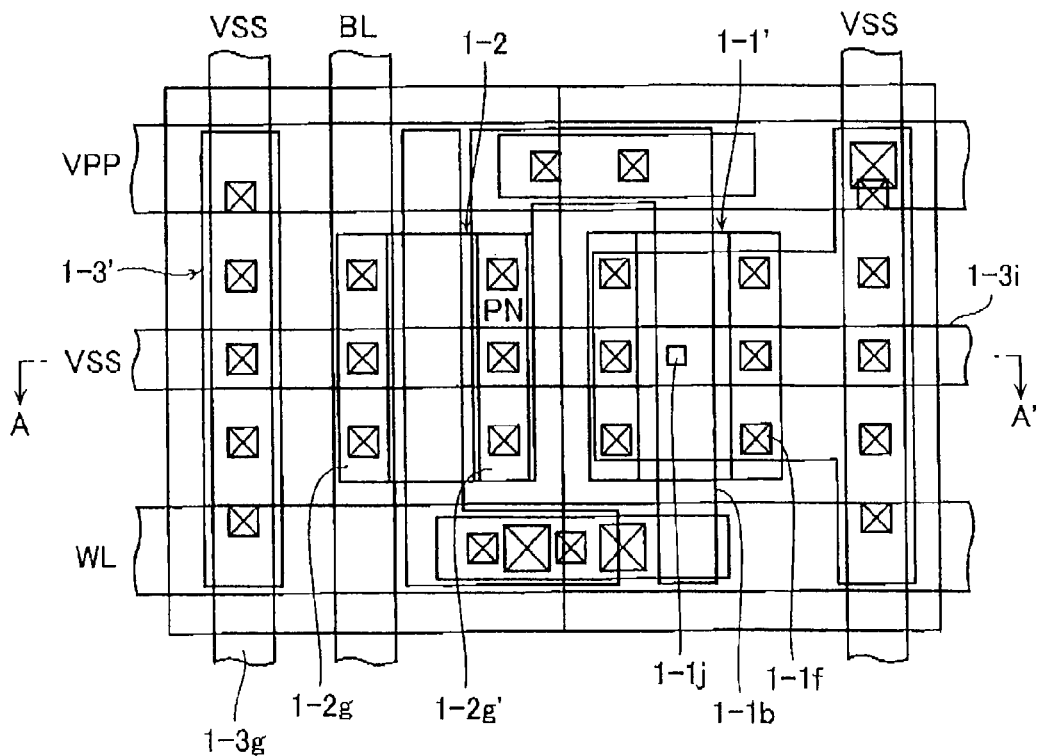
FIG. 12A is a plan view to describe a specific structure of the memory cell MC (an antifuse element 1-1', a selection gate 1-2, a bulk electrode 1-3) according to the fifth embodiment of the present invention.
Figure 12B:
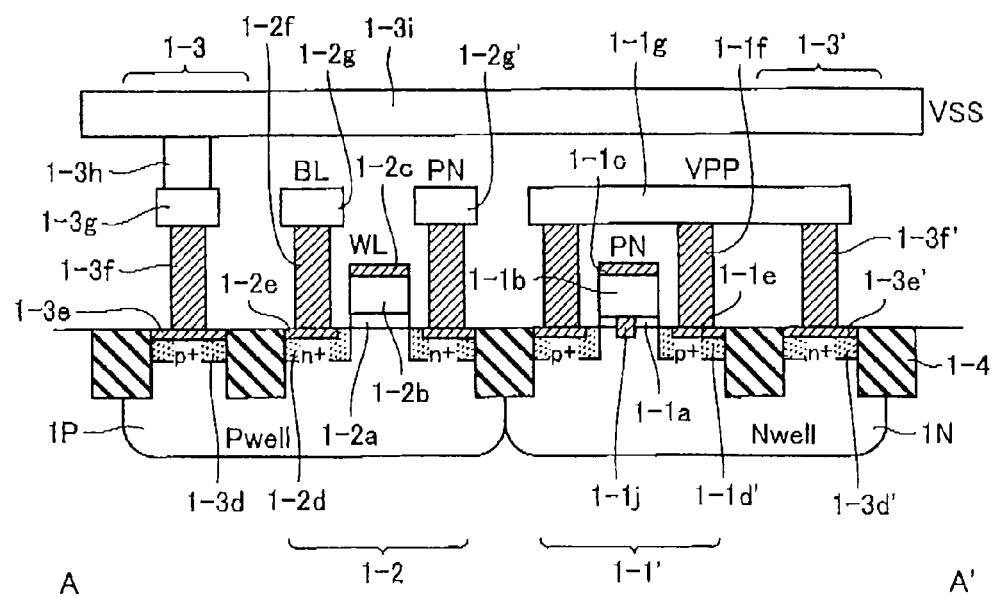
FIG. 12B is a sectional view explaining, as an example, specific structure of the memory cell MC (antifuse element 1-1', selection gate 1-2, a bulk electrode 1-3) according to the fifth embodiment of the present invention.

With reference to FIG. 12A and FIG. 12B, a specific structure example of the memory cell MC (the antifuse element 1-1', the selection gate 1-2, and the bulk electrode 1-3) is described. FIG. 12A is a plan view of the memory cell MC. FIG. 12B is an A-A' sectional view of FIG. 12A.

The antifuse element 1-1' is a PMOS transistor formed in an N type well 1N formed on the P type substrate. A Gate insulation film 1-1a and a gate electrode 1-1b formed of polysilicon are laminated in this order on this N type well 1N. This gate electrode 1-1b is defined as the program node PN. A silicide layer 1-1c as a compound of metal and silicon is laminated on the surface of the gate electrode 1-1b to suppress the resistance of the gate electrode. A P+ type diffusion layer 1-1d' as the source/drain region of the PMOS transistor is formed on the surface of the N type well 1N at both ends of the gate electrode 1-1b.

On the P+ type diffusion layer 1-1d' forming a source/drain region, contacts 1-1f are formed through silicide layers 1-1e. As a wiring for short-circuiting these contacts 1-1f, a wiring layer 1-1g is formed thereon. This wiring layer 1-1g is also connected to the bulk electrode 1-3' formed in the N type well 1N in the same way.

The bulk electrode 1-3' comprises: an N+ type diffusion layer 1-3d' formed on the N type well 1N; a silicide layer 1-3e' formed on the P+ type diffusion layer 1-3d'; and a contact 1-3f' formed on the silicide layer 1-3e'. The contact 1-3f' is connected to the wiring layer 1-1g.

The selection gate 1-2 is an NMOS transistor formed in the P type well 1P formed on the P type substrate, like the first embodiment. A silicide layer 1-2e is connected to a contact 1-2f. In addition, the contact 1-2f is connected to the bit line BL and the program node PN via metal layers 1-2g, 1-2g' in the upper layer.

Moreover, a bulk electrode 1-3 that is the same as that of the first embodiment is formed on the surface of the P type well 1P and near the selection gate 1-2.

Next, a write operation of the OTP memory according to the fifth embodiment is described with reference to FIG. 13A-FIG. 13E. FIG. 13A-FIG. 13E illustrates the change in sectional structure of the antifuse element 1-1' during a write operation according to the fifth embodiment.

In an initial stand-by state (FIG. 13A), the gate electrode 1-1b is in a high impedance state (HiZ), a voltage of the program node PN is 0 V, and the N type well 1N is biased by the ground potential VSS.

In this state, the gate insulation film 1-1a is not destroyed yet, and the gate insulation film 1-1a shows good insulation property. In this state, a leak current hardly occurs.

Thereafter, the voltage VPP of the node N1 or the P+ type diffusion layer 1-1d' is boosted up to 6 V (FIG. 13B). In addition, the word line WL is activated, and the selection gate 1-2 is in a conductive state. Also, the voltage of the program node PN is set to 0 V. This starts a writing state (FIG. 13C).

Because this writing state is kept for a certain period of time, a pinhole 1-1j of about 50 nm in diameter is generated in a short time in the gate insulation film 1-1a.

Figure 13D:
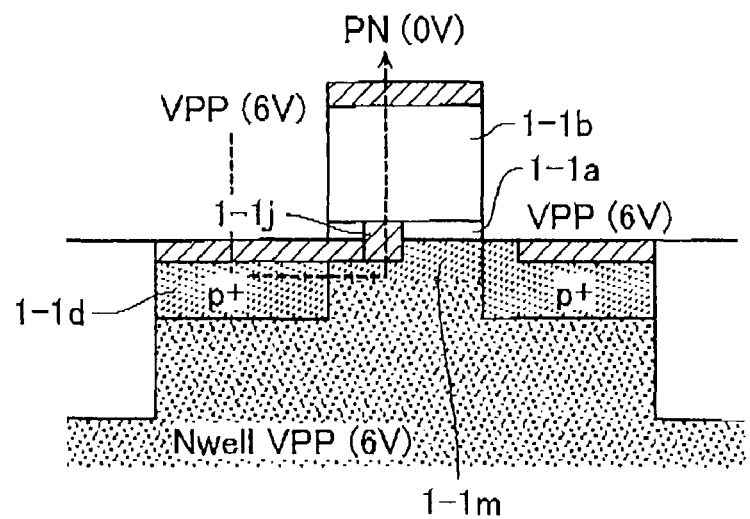
FIG. 13D shows variation in the sectional structure of the antifuse element 1-1' caused by a write operation in the fifth embodiment.

Then, as indicated by a broken line in FIG. 13D, a writing current flows along a current path from the P+ type diffusion layer 1-1d' which is applied with the voltage VPP (6 V) to the gate electrode 1-1b via the pinhole 1-1j.

Figure 13E:
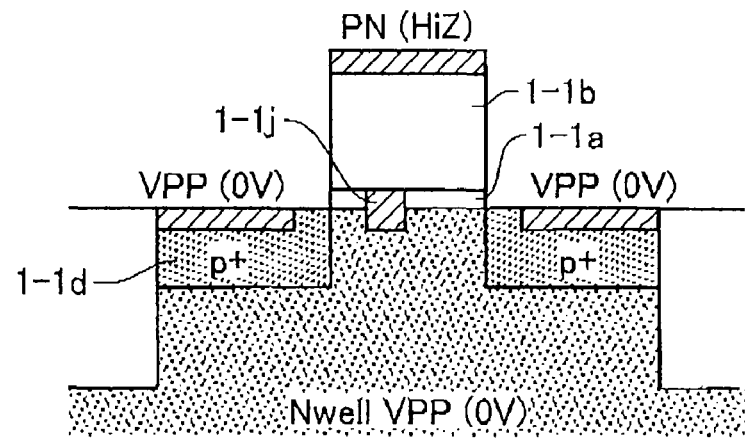
FIG. 13E shows variation in the sectional structure of the antifuse element 1-1' caused by a write operation in the fifth embodiment.
Figure 14D:
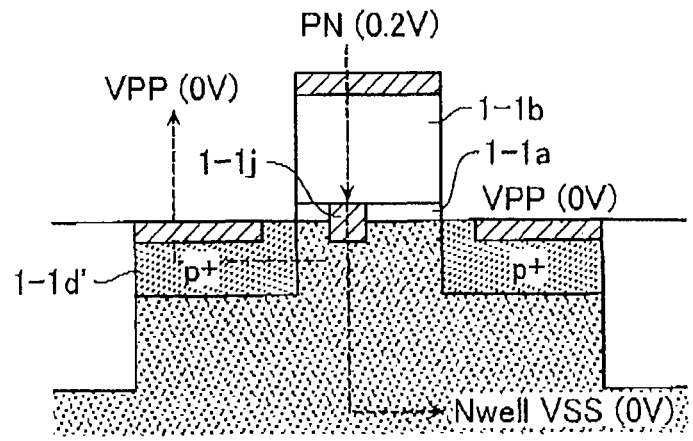
FIG. 14D shows a reading operation of the antifuse element 1-1' of the OTP memory according to the fifth embodiment.

After such a conduction path is once formed, the conduction path never disappear, even if the voltage VPP of the p+ type diffusion layer 1-1d' is returned to 0 V after completion of the write operation, as shown in FIG. 13E Then, a reading operation of the antifuse element 1-1' of the OTP memory according to the fifth embodiment is shown in FIG. 14A-FIG. 14D. FIG. 14A shows a reading standby state in the memory cell MC ("0" cell) where "0" data is written. FIG. 14B shows a reading state in the "0" cell. FIG. 14C shows a reading standby state in the memory cell ("1" cell) where "1" data is written. FIG. 14D shows a reading state in the "1" cell.

In the reading standby state in the "0" cell shown in FIG. 14A and the reading standby state in the "1" cell shown in FIG. 14C, the voltage VPP is set at 0 V. Moreover, the bulk electrode 1-3 (the N type well 1N) is also biased to 0 V. Also, the gate electrode 1-1b of the antifuse element 1-1' is in a high impedance state, because the selection gate 1-2 is in a non-conductive state (HiZ). Thus, irrespective of existence or non-existence of the pinhole 1-1j in the gate insulation film 1-1a, a current does not flow through the antifuse element 1-1'.

Then, in an actual reading operation, the selection gate 1-2 is turned on by activating the word line WL, and a minute bias current is injected into the bit line BL by activating the bit line bias circuit 3-3. Then, in the antifuse element 1-1' ("0" cell, FIG. 14B) where the gate insulation film 1-1a is not destroyed, the program node PN or the gate electrode 1-1b almost rises to the power supply voltage VDD (1 V).

On the other hand, in the antifuse element 1-1' ("1" cell, FIG. 14D) where the gate insulation film 1-1a is destroyed and a pinhole 1-1b is formed therein, a reading current flows from the gate electrode 1-1b to the P+ type diffusion layer 1-1d' that is biased at 0 V, and then the potential of the gate electrode 1-1b as the program node PN remains at a relatively low potential (e.g., 0.2 V).

In this case, a leak current is expected to flow towards the N type well 1N that is biased to 0 V. This leak current is caused by the crystal defect generated just beneath the conduction path created by movement of metal from the silicide layer 1-1e, or just beneath the pinhole 1-1j. The leak current may be also caused by the destruction of the junction between the P+ type diffusion region 1-1d' of the antifuse element 1-1' and the N+ type diffusion region 1-3d' of the bulk electrode 1-3'.

However, even if such a leak current occurs, a reading current flowing through the program node PN does not decrease due to the influence of the leak current. This is because the voltage VPP of the P type diffusion layer 1-1d' is biased to 0 V by the power supply circuit 4. Therefore, there is a large voltage difference at the program node PN between the "0" cell and the "1" cell. This difference is precisely detected in the sense amplifier.

Figure 14E:
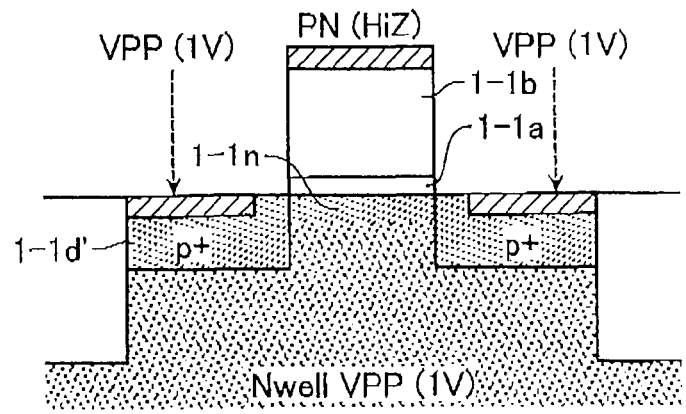
FIG. 14E shows a reading operation of the antifuse element 1-1' of the conventional OTP memory.
Figure 14F:
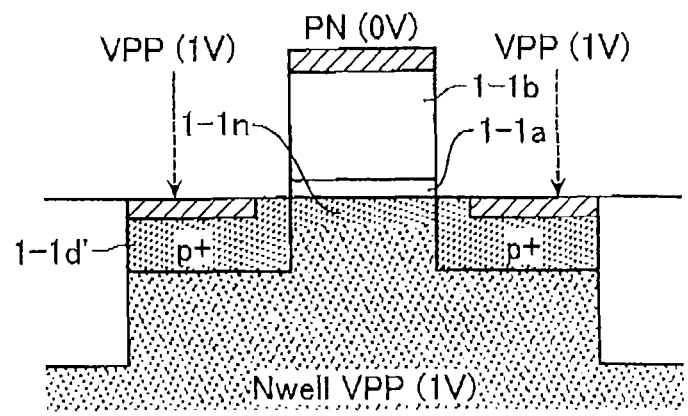
FIG. 14F shows a reading operation of the antifuse element 1-1' of the conventional OTP memory.
Figure 14G:
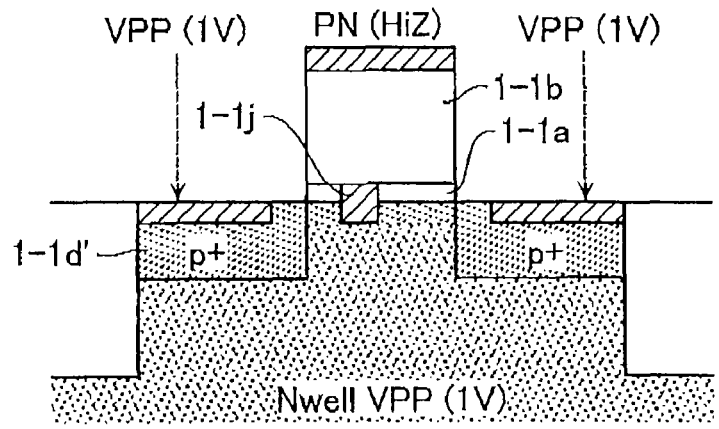
FIG. 14G shows a reading operation of the antifuse element 1-1' of the conventional OTP memory.
Figure 14H:
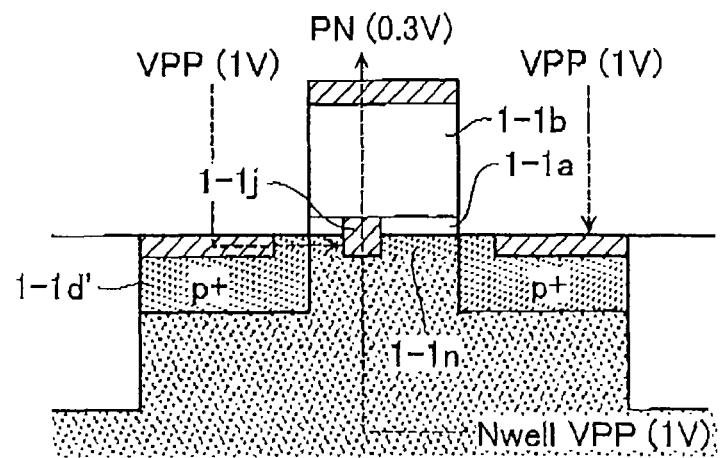
FIG. 14H shows a reading operation of the antifuse element 1-1' of the conventional OTP memory.

Next, with reference to FIG. 14E-FIG. 14H, the reading operation in the conventional antifuse element is shown, and it is compared with the operation of antifuse element 1-1' of the present embodiment. FIG. 14E shows a reading standby state in the "0" cell. FIG. 14F shows a reading state in the "0" cell. FIG. 14G shows a reading standby state in the "1" cell. FIG. 14H shows a reading state in the "1" cell.

In this conventional art, a voltage VPP (approximately 1 V) is applied to a P+ type diffusion layer 1-1d' at the time of a reading operation, and an operation for pulling up charges from a bit line connected to a selected memory cell is performed.

First, as shown in FIGS. 14E and 14G, in the reading stand-by state prior to a reading operation, a low voltage (e.g., VPP=1 V) that does not destroy the gate insulation film 1-1a is applied to the node N1.

At this point, similarly, the bulk electrode 1-3 is biased to 1 V.

Moreover, the program node PN or the gate electrode 1-1b is set to a high impedance state (HiZ), since the selection gate 1-2 is set to a non-conductive state. In both the "0" cell and the "1" cell, a current does not flow through the program node PN.

As shown in FIGS. 14F and 14H, the selection gate 1-2 is set to a conductive state by activating the word line WL, and the bit line BL and the program node PN (i.e., the gate electrode 1-1b) are electrically connected to pull up charges of the program node PN from the bit line BL.

Then, in the "0" cell, the gate electrode 1-1b or the program node PN falls to 0 V, as shown in FIG. 14F. This is because the gate insulation film 1-1a is not destroyed in the "0" cell, and the gate electrode 1-1b is electrically insulated from the node N1 and the P+ type diffusion layer 1-1d' (1 V).

On the other hand, in the "1" cell, the program node PN is kept, in an ideal case, at a high potential (ideally, 1 V) as shown in FIG. 14H, because of a conduction path from the P+ type diffusion layer 1-1d' that is applied with 1 V, via the N type well 1N and the pinhole 1-1j, to the gate electrode 1-1b.

However, the problem herein is that the reading current varies greatly depending on a state of the pinhole 1-1j formed in the memory cell MC. That is, this reading current relates not only to the state of the pinhole 1-1j but also to a depth of the N type well 1N and the depth of the inversion layer 1-1n.

If the size of the pinhole 1-1j is large, the resistance of the conduction path becomes small, and a large reading current flows from the node N1 biased at 1 V and the P+ type diffusion layer 1-1d'. This makes the potential of the program node PN be kept at a high potential, and "1" or "0" data in the memory cell may be correctly read without an error.

However, if the size of the pinhole 1-1j is small, the resistance of the conduction path becomes high, and a reading current becomes small. Then, the potential of the program node PN is hard to become a high potential. When the potential of the program node PN or the gate electrode 1-1b becomes low, the depth of the inversion layer 1-1n formed in the channel region becomes large, and the resistance of the conduction path becomes larger.

When the potential of the gate electrode 1-1b becomes low, another conduction path is formed by the inversion layer 1-1n and the pinhole 1-1j, thereby charging the program node PN to about 0.3 V. However, such small voltage is not enough for the potential difference against the "0" cell, and there still remains a fear of false reading.

On the other hand, in the present embodiment, the potential of the P+ type diffusion layer 1-1d' of the antifuse element 1-1' is kept at 0 V at the time of a reading operation by an operation of power supply circuit 4. Therefore, even if crystalline defect and junction destruction occurs, a reading current from a memory cell does not deteriorate, and it is possible to provide an OTP memory that can correctly read data stored in a memory cell.

The embodiments of the invention have been described above though the present invention is not limited to these embodiments but rather can be given various modifications, additions and so forth without departing from the scope and spirit of the invention.

What is claimed is:

1. A nonvolatile semiconductor memory device comprising:
    a memory cell array including memory cells arranged at intersections of a plurality of word lines and a plurality of bit lines intersecting each other, each of the memory cells comprising an antifuse element comprising a MOS transistor, the MOS transistor including a first terminal, a second terminal, and a gate electrode formed on a gate insulating film, and a select transistor connected between the second terminal and one of the bit lines, and being selectively turned on;
    a row decoder configured to receive a writing instruction signal and a reading instruction signal to selectively activate one of the word lines according to an input state of a row address signal;
    a data buffer configured to receive a data input signal and drive corresponding one of the bit lines when the writing instruction signal is received, and amplify a minute reading signal transmitted to one of the bit lines to output a data output signal when the reading instruction signal is received; and
    a power supply circuit configured to supply a certain voltage to the first terminal of the memory cell,
    wherein the data buffer drives the corresponding one of the bit lines to a first voltage while the power supply circuit supplies a second voltage higher than the first voltage to the first terminal when the writing instruction signal is received,
    whereas the data buffer drives the corresponding one of the bit lines to a third voltage while the power supply circuit supplies a fourth voltage lower than the third voltage to the first terminal when the reading instruction signal is received.

2. The nonvolatile semiconductor memory device according to claim 1, wherein the power supply circuit includes a charge pump circuit configured to boost a power supply voltage up to a certain boosted voltage in response to the writing instruction signal thereby supplying the boosted voltage to an output terminal.

3. The nonvolatile semiconductor memory device according to claim 1, wherein
the power supply circuit comprises
an output terminal operative to output an certain boosted voltage, the boosted voltage being generated by boosting a power supply voltage, and
a ground potential clamping circuit configured to clamp the output terminal to a ground potential, and
the ground potential clamping circuit is turned on in response to the reading instruction signal.

4. The nonvolatile semiconductor memory device according to claim 3, wherein the power supply circuit includes a charge pump circuit configured to boost a power supply voltage up to a certain boosted voltage in response to the writing instruction signal thereby supplying the boosted voltage to an output terminal.

5. The nonvolatile semiconductor memory device according to claim 1, wherein
the power supply circuit comprises
an output terminal operative to output an certain boosted voltage, the boosted voltage being generated by boosting a power supply voltage, and
a ground potential clamping circuit configured to clamp the output terminal to a ground potential.

6. The nonvolatile semiconductor memory device according to claim 5, wherein the power supply circuit includes a charge pump circuit configured to boost a power supply voltage up to a certain boosted voltage in response to the writing instruction signal thereby supplying the boosted voltage to an output terminal.

7. The nonvolatile semiconductor memory device according to claim 1, wherein
the power supply circuit comprises
an output terminal operative to output an certain boosted voltage, the boosted voltage being generated by boosting a power supply voltage, and
a ground potential clamping circuit configured to clamp the output terminal to a ground potential, and
the ground potential clamping circuit is turned on in response to the reading instruction signal.

8. The nonvolatile semiconductor memory device according to claim 7, wherein the power supply circuit includes a charge pump circuit configured to boost a power supply voltage up to a certain boosted voltage in response to the writing instruction signal thereby supplying the boosted voltage to an output terminal.

9. The nonvolatile semiconductor memory device according to claim 1, wherein
a transistor configuring the memory cell is an n type enhancement type MOS transistor.

10. The nonvolatile semiconductor memory device according to claim 1, wherein
a transistor configuring the memory cell is an n type depression type MOS transistor.

11. A nonvolatile semiconductor memory device comprising:
a memory cell array including memory cells arranged at intersections of a plurality of word lines and a plurality of bit lines intersecting each other, each of the memory cells comprising an antifuse element comprising a MOS transistor, the MOS transistor including a first terminal, a second terminal, and a gate electrode formed on a gate insulating film, and a select transistor connected between the second terminal and one of the bit lines, and being selectively turned on;
a row decoder configured to receive a writing instruction signal and a reading instruction signal to selectively activate one of the word lines according to an input state of a row address signal;
a data buffer configured to receive a data input signal when the writing instruction signal is received, and drive corresponding one of the bit lines and amplify a minute reading signal transmitted to one of the bit lines to output a data output signal when the reading instruction signal is received;
a plurality of plate lines commonly coupled to the memory cells arranged along a first direction;
a plate line drive circuit configured to selectively drive the plate lines according to an output signal of the row decoder; and
a power supply circuit configured to supply a boosted voltage,
the plate line drive circuit being operative to supply a certain boosted voltage to the plate lines while the data buffer drives the corresponding one of the bit lines to a first voltage lower than the boosted voltage according to the writing instruction signal, the boosted voltage being generated by the power supply circuit,
whereas
the plate line drive circuit being operative to supply a second voltage lower than the boosted voltage to the plate lines while the data buffer drives the corresponding one of the bit lines to a third voltage higher than the second voltage according to the read instruction signal.

12. The nonvolatile semiconductor memory device according to claim 11,
wherein a transistor configuring the memory cell is p type MOS transistor.

13. The nonvolatile semiconductor memory device according to claim 11, wherein the power supply circuit includes a charge pump circuit configured to boost a power supply voltage up to a certain boosted voltage in response to the writing instruction signal thereby supplying the boosted voltage to an output terminal.

14. The nonvolatile semiconductor memory device according to claim 11, wherein
the power supply circuit comprises
an output terminal operative to output an certain boosted voltage, the boosted voltage being generated by boosting a power supply voltage, and
a ground potential clamping circuit configured to clamp the output terminal to a ground potential, and
the ground potential clamping circuit is turned on in response to the reading instruction signal.

15. The nonvolatile semiconductor memory device according to claim 14, wherein the power supply circuit includes a charge pump circuit configured to boost a power supply voltage up to a certain boosted voltage in response to the writing instruction signal thereby supplying the boosted voltage to an output terminal.

16. The nonvolatile semiconductor memory device according to claim 11, wherein
the power supply circuit comprises
an output terminal operative to output an certain boosted voltage, the boosted voltage being generated by boosting a power supply voltage, and
a ground potential clamping circuit configured to clamp the output terminal to a ground potential.

* * * * *